US011495735B2

(12) United States Patent
Shibata et al.

(10) Patent No.: US 11,495,735 B2
(45) Date of Patent: Nov. 8, 2022

(54) SPIN-CURRENT MAGNETIZATION ROTATIONAL ELEMENT AND ELEMENT ASSEMBLY

(71) Applicant: TDK CORPORATION, Tokyo (JP)

(72) Inventors: Tatsuo Shibata, Tokyo (JP); Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 82 days.

(21) Appl. No.: 16/079,800

(22) PCT Filed: Jul. 25, 2017

(86) PCT No.: PCT/JP2017/026831
§ 371 (c)(1),
(2) Date: Aug. 24, 2018

(87) PCT Pub. No.: WO2018/061435
PCT Pub. Date: Apr. 5, 2018

(65) Prior Publication Data
US 2019/0058111 A1 Feb. 21, 2019

(30) Foreign Application Priority Data
Sep. 28, 2016 (JP) .............................. JP2016-189886

(51) Int. Cl.
*H01L 43/02* (2006.01)
*H01L 27/22* (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC ... G11C 11/1675; H01L 27/222; H01L 43/02; H01L 43/08; H01L 43/10; H01L 43/12
(Continued)

(56) References Cited

U.S. PATENT DOCUMENTS

| 2004/0092039 A1 | 5/2004 | Anthony et al. |
| 2005/0219895 A1 | 10/2005 | Guo et al. |

(Continued)

FOREIGN PATENT DOCUMENTS

| FR | 2963152 A1 * | 1/2012 | ......... G11C 11/1675 |
| JP | 2005-303298 A | 10/2005 | |

(Continued)

OTHER PUBLICATIONS

Sep. 19, 2017 International Search Report issued in International Patent Application No. PCT/JP2017/026831.
(Continued)

*Primary Examiner* — Meiya Li
(74) *Attorney, Agent, or Firm* — Oliff PLC

(57) ABSTRACT

A spin-current magnetization rotational element includes: a ferromagnetic metal layer; and a spin-orbit torque wiring that extends in a first direction intersecting a stacking direction of the ferromagnetic metal layer and is bonded to the ferromagnetic metal layer. A direction of a spin injected into the ferromagnetic metal layer from the spin-orbit torque wiring intersects a magnetization direction of the ferromagnetic metal layer. The ferromagnetic metal layer has shape anisotropy and has a demagnetizing field distribution caused by the shape anisotropy. The demagnetizing field distribution generates an easy magnetization rotational direction in which the magnetization of the ferromagnetic metal layer is most easily reversed. The easy magnetization rotational direction intersects the first direction in a plan view seen from the stacking direction.

17 Claims, 9 Drawing Sheets

(51) Int. Cl.
| | |
|---|---|
| *H01L 43/10* | (2006.01) |
| *H01L 43/12* | (2006.01) |
| *G11C 11/16* | (2006.01) |
| *H01L 43/08* | (2006.01) |
| *G11C 11/18* | (2006.01) |

(52) U.S. Cl.
CPC .......... *G11C 11/1675* (2013.01); *G11C 11/18* (2013.01); *H01L 27/222* (2013.01); *H01L 43/08* (2013.01); *H01L 43/12* (2013.01); *H01L 43/10* (2013.01)

(58) Field of Classification Search
USPC .................................................. 257/420–426
See application file for complete search history.

(56) References Cited

U.S. PATENT DOCUMENTS

| | | | |
|---|---|---|---|
| 2008/0315335 | A1 | 12/2008 | Ueda |
| 2014/0056060 | A1 | 2/2014 | Khvalkovskiy et al. |
| 2015/0069555 | A1* | 3/2015 | Sakai .................. G11C 11/1653 257/421 |
| 2015/0129995 | A1 | 5/2015 | Wang et al. |
| 2015/0213868 | A1 | 7/2015 | Wu et al. |
| 2017/0018297 | A1* | 1/2017 | Zang .................... G11C 11/1675 |
| 2017/0222135 | A1* | 8/2017 | Fukami .................. H01L 43/08 |
| 2018/0005677 | A1* | 1/2018 | Gaudin ............... G11C 11/1673 |

FOREIGN PATENT DOCUMENTS

| | | |
|---|---|---|
| JP | 2010-016260 A | 1/2010 |
| JP | 4568303 B2 | 10/2010 |
| JP | 4580211 B2 | 11/2010 |
| JP | 4678144 B2 | 4/2011 |
| JP | 2014/045196 A | 3/2014 |
| NO | 2016/021468 A1 | 2/2016 |
| WO | WO-2016021468 A1 * | 2/2016 ............. H01L 43/08 |

OTHER PUBLICATIONS

Miron et al.; "Perpendicular switching of a single ferromagnetic layer induced by in-plane current injection"; Nature, vol. 476, pp. 189-194, Aug. 11, 2011.

Yu et al.; "Switching of perpendicular magnetization by spin-orbit torques in the absence of external magnetic fields"; Nature Nanotechnology, vol. 9, Published May 11, 2014, pp. 548-554.

Liu et al.; "Current-Induced Switching of Perpendicularly Magnetized Magnetic Layers Using Spin Torque from the Spin Hall Effect"; Physical Review Letters, vol. 109, 096602, Aug. 31, 2012, pp. 096602-1 to 096602-5.

Lee et al.; "Threshold current for switching of a perpendicular magnetic layer induced by spin Hall effect"; Applied Physics Letters, vol. 102, Published Mar. 20, 2013, pp. 112410-1 to 112410-5.

Yu et al.; "Current-driven perpendicular magnetization switching in Ta/CoFeB/[TaOx or MgO/TaOx] films with lateral structural asymmetry"; Applied Physics Letters, Published Sep. 12, 2014, vol. 105, pp. 102411-1 to 102411-5.

Fukami et al.; "A spin-orbit torque switching scheme with collinear magnetic easy axis and current configuration"; Nature Nanotechnology, vol. 11, 621, Published Mar. 21, 2016, pp. 1-6.

* cited by examiner

SPIN-CURRENT MAGNETIZATION ROTATIONAL ELEMENT AND ELEMENT ASSEMBLY

TECHNICAL FIELD

The invention relates to a spin-current magnetization rotational element and an element assembly.

Priority is claimed on Japanese Patent Application No. 2016-189886, filed Sep. 28, 2016, the content of which is incorporated herein by reference.

BACKGROUND ART

A giant magnetoresistance (GMR) element including a multilayered film of a ferromagnetic layer and a nonmagnetic layer and a tunneling magnetoresistance (TMR) element using an insulating layer (a tunnel barrier layer, a barrier layer) as a nonmagnetic layer are known. In general, a TMR element has higher electric resistance and a higher magnetoresistance (MR) ratio than a GMR element. Accordingly, TMR elements have attracted attention as elements for a magnetic sensor, a high-frequency component, a magnetic head, and a nonvolatile RAM (MRAM).

An MRAM reads and writes data using a characteristic that element resistance of a TMR element varies when magnetization directions of two ferromagnetic layers with an insulating interposed therebetween are changed. A writing (magnetization reversing) method using a magnetic field formed by a current or a writing (magnetization reversing) method using a spin transfer torque (STT) which is generated by causing a current to flow in a stacking direction of a magnetoresistance effect element is known as a writing method of an MRAM.

Magnetization reversal of a TMR element using an STT is efficient in view of energy efficiency, but a reversing current density for reversing magnetization is high. In view of a long life span of a TMR element, it is preferable that the reversing current density be as low as possible. This is also true of a GMR element.

Recently, magnetization reversal using a net spin current which is generated by a spin-orbit interaction has attracted attention as means for decreasing a reversing current (for example, see Non-Patent Document 1). A net spin current which is generated by the spin-orbit interaction induces a spin orbit torque (SOT) and causes magnetization reversal due to the SOT. Although a mechanism thereof is not clear, it is known that an SOT is also generated due to a Rashba effect in an interface between different materials. A net spin current is generated by causing the same number of electrons with an upward spin and the same number of electrons with a downward spin to flow reversely, and flows of electric charges are cancelled out. Accordingly, a current flowing in a magnetoresistance effect element is zero and extension of a life span of a magnetoresistance effect element is expected.

Two functions are required for an MRAM in view of recording of data. One function is to store data which has been written once over a long term, and the other function is to easily read and write data.

For example, Patent Document 1 discloses a method of curbing an external influence on a magnetoresistance effect element to store data over a long term. Specifically, a shape when a magnetoresistance effect element is seen in a stacking direction thereof is set to a circular shape.

On the other hand, Patent Document 2 and Non-Patent Document 2 discloses that it is necessary to disturb symmetry of magnetization which is reversed in order to perform magnetization reversal (reading and writing of data) using an SOT. As the method of disturbing the magnetization symmetry, a method of applying an external magnetic field and a method of changing a magnitude of magnetic anisotropy in an in-plane direction of a magnetoresistance effect element are also described.

CITATION LIST

Patent Literature

[Patent Document 1]
Japanese Unexamined Patent Application, First Publication No. 2010-16260
[Patent Document 2]
US Patent Application Publication No. 2015/0129995

Non-Patent Literature

[Non-Patent Document 1]
I. M. Miron, K. Garello, G. Gaudin, P. -J. Zermatten, M. V. Costache, S. Auffret, S. Bandiera, B. Rodmacq, A. Schuhl, and P. Gambardella, Nature, 476, 189(2011).
[Non-Patent Document 2]
Guoqiang Yu, et al., Nature Nanotechnology, DOI:10.1038/NNANO.2014.94.

SUMMARY OF INVENTION

Technical Problem

However, a magnetic field source is necessary for applying an external magnetic field. Separate provision of a magnetic field source causes a decrease in a degree of integration of an integrated circuit including spin-current magnetization rotational elements.

When the magnitude of magnetic anisotropy varies in an in-plane direction of a magnetoresistance effect element, magnetization of a part having small magnetic anisotropy may be reversed due to application of an unexpected external force (such as an external magnetic field or heat). The unexpected magnetization reversal becomes noise in the data and hinders long-term storage of data.

Particularly, when a magnitude of ferromagnetism in a magnetoresistance effect element is large enough to form a magnetic domain wall, magnetization reversal in a part having small magnetic anisotropy may induce magnetization reversal in the other part to rewrite data.

The invention is made in consideration of the above-mentioned circumstances and an objective thereof is to provide a spin-current magnetization rotational element that can be reversed in magnetization without applying an external magnetic field.

Solution to Problem

The inventors found that a direction in which magnetization of a ferromagnetic material can be easily reversed is formed by giving anisotropy to a demagnetizing field acting on a magnetoresistance effect element and magnetization reversal using an SOT can be caused without applying an external magnetic field. That is, the invention provides the following means for achieving the above-mentioned objective.

(1) A spin-current magnetization rotational element according to a first aspect includes: a ferromagnetic metal layer; and a spin-orbit torque wiring that extends in a first direction intersecting a stacking direction of the ferromagnetic metal layer and is bonded to the ferromagnetic metal layer, wherein a direction of a spin injected into the ferromagnetic metal layer from the spin-orbit torque wiring intersects a magnetization direction of the ferromagnetic metal layer, the ferromagnetic metal layer has shape anisotropy and has a demagnetizing field distribution caused by the shape anisotropy, the demagnetizing field distribution generates an easy magnetization rotational direction in which the magnetization of the ferromagnetic metal layer is most easily reversed, and the easy magnetization rotational direction intersects the first direction in a plan view seen from the stacking direction.

(2) In the spin-current magnetization rotational element according to the aspect, when the ferromagnetic metal layer is divided by a line segment which passes through a midpoint between two points separated most in a second direction perpendicular to the first direction and which is parallel to the first direction, areas of two divided parts may be different from each other in a plan view seen from the stacking direction.

(3) In the spin-current magnetization rotational element according to the aspect, a shape of the ferromagnetic metal layer in a plan view seen from the stacking direction may be a polygon having 2n+1 (where n is a natural number) apexes.

(4) In the spin-current magnetization rotational element according to the aspect, all direction vectors from the center of gravity of the polygon to the apexes may be different from a direction of a current flowing in the spin-orbit torque wiring.

(5) In the spin-current magnetization rotational element according to the aspect, the apexes of the polygon may be curved.

(6) In the spin-current magnetization rotational element according to the aspect, the magnetization of the ferromagnetic metal layer may be oriented in the stacking direction.

(7) In the spin-current magnetization rotational element according to the aspect, a nonmagnetic layer and a fixed layer in which a magnetization direction is fixed may be additionally provided on a surface of the ferromagnetic metal layer opposite to the spin-orbit torque wiring.

(8) In the spin-current magnetization rotational element according to the aspect, a plurality of ferromagnetic metal layers may be arranged in the first direction in which the spin-orbit torque wiring extends, and the easy magnetization rotational directions of the neighboring ferromagnetic metal layers may be opposite to each other.

(9) An element assembly according to a second aspect includes a plurality of spin-current magnetization rotational elements according to the above aspect.

(10) In the element assembly according to the aspect, the ferromagnetic metal layers constituting the plurality of spin-current magnetization rotational elements may have shape anisotropy in the same direction.

(11) In the element assembly according to the aspect, the easy magnetization rotational directions of the neighboring ferromagnetic metal layers may be opposite to each other.

Advantageous Effects of Invention

With the spin-current magnetization rotational element according to the above-mentioned aspects, it is possible to cause magnetization reversal without applying an external magnetic field.

DESCRIPTION OF EMBODIMENTS

Figure 1:
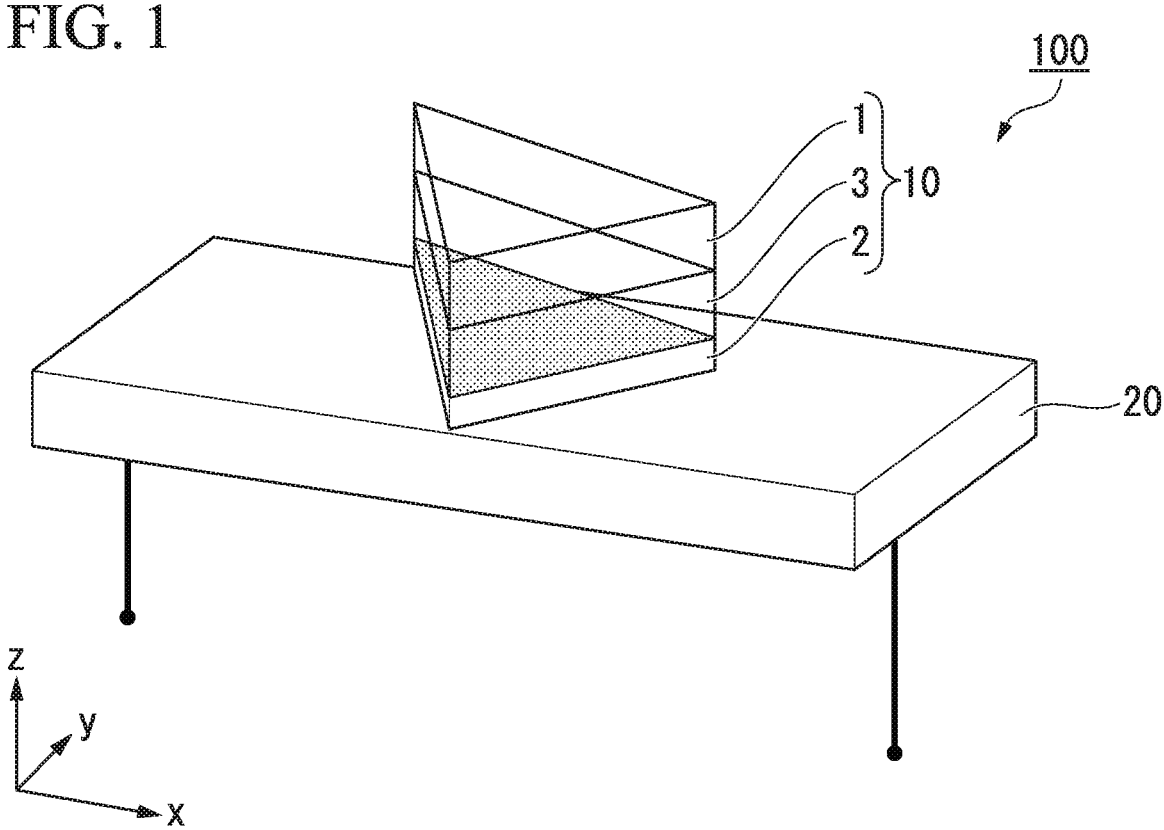
FIG. 1 is a perspective view schematically showing a configuration of a spin-current magnetization rotational element according to an embodiment of the invention.

Hereinafter, the invention will be described in detail with reference to the accompanying drawings. In the drawings used for the following description, feature parts may be enlarged for the purpose of convenience and dimensional ratios of elements or the like may be different from actual values. Materials, dimensions, and the like which are described in the following description are examples, and the invention is not limited thereto and can be appropriately modified as long as advantageous effects of the invention are achieved.

(Spin-Current Magnetization Rotational Element)

FIG. 1 is a perspective view schematically showing a configuration of a spin-current magnetization rotational element according to an aspect of the invention.

The spin-current magnetization rotational element 100 according to the aspect of the invention includes a magnetoresistance effect element 10 and a spin-orbit torque wiring 20.

In the following description, a stacking direction of the magnetoresistance effect element 10 is defined as a z direction, a first direction in which the spin-orbit torque wiring 20 extends is defined as an x direction, and a second direction which is perpendicular to both the z direction and the x direction is defined as a y direction.

<Magnetoresistance Effect Element>

The magnetoresistance effect element 10 includes a first ferromagnetic metal layer 1 in which a magnetization direction is fixed, a second ferromagnetic metal layer 2 in which a magnetization direction is variable, and a nonmagnetic layer 3 which is interposed between the first ferromagnetic metal layer 1 and the second ferromagnetic metal layer 2. A "ferromagnetic metal layer" in the claims corresponds to the second ferromagnetic metal layer 2.

The magnetoresistance effect element 10 functions by causing magnetization of the first ferromagnetic metal layer 1 to be fixed to one direction and causing a magnetization direction of the second ferromagnetic metal layer 2 to vary relatively. In a coercive force difference type (a pseudo spin valve type) magnetoresistance effect element 10, since a holding force of the first ferromagnetic metal layer is larger than a coercive force of the second ferromagnetic metal layer, the magnetization direction of the first ferromagnetic metal layer is fixed. In an exchange bias type (a spin valve type) magnetoresistance effect element 10, the magnetization direction of the first ferromagnetic metal layer is fixed due to exchange coupling with an antiferromagnetic layer.

The magnetoresistance effect element 10 serves as a tunneling magnetoresistance (TMR) element when the nonmagnetic layer 3 is formed of an insulator, and serves as a giant magnetoresistance (GMR) element when the nonmagnetic layer 3 is formed of a metal.

A stacked structure of a known magnetoresistance effect element can be employed as a stacked structure of the magnetoresistance effect element. For example, each layer may include a plurality of layers or may include another layer such as an antiferromagnetic layer for fixing the magnetization direction of the first ferromagnetic metal layer 1. The first ferromagnetic metal layer 1 is referred to as a fixed layer or a reference layer, and the second ferromagnetic metal layer 2 is referred to as a free layer or a memory layer.

A known material can be used as a material of the first ferromagnetic metal layer 1. For example, a metal selected from the group consisting of Cr, Mn, Co, Fe, and Ni and an alloy containing one or more types of these metals and exhibiting ferromagnetism may be used. An alloy containing these metals and one or more types of the elements B, C, and N may be used. A specific example of the first ferromagnetic metal layer 1 is Co—Fe or Co—Fe—B.

In order to obtain a higher output, it is preferable that a Heusler alloy such as $Co_2FeSi$ be used for the first ferromagnetic metal layer 1. The Heusler alloy contains an intermetallic compound having a chemical composition of $X_2YZ$. Here, X is a transition metal element or a precious metal element in the Co, Fe, Ni, or Cu group in the periodic table, Y is a transition metal in the Mn, V, Cr, or Ti group or the same element as X, and Z is a typical element of Groups III to V. For example, $Co_2FeSi$, $Co_2MnSi$, or $Co_2Mn_{1-a}Fe_aAlb_Si_{1-b}$ can be used as the Heusler alloy.

In order to further increase the coercive force of the first ferromagnetic metal layer 1 with respect to the second ferromagnetic metal layer 2, a layer containing an antiferromagnetic material such as IrMn or PtMn may be brought into contact with the first ferromagnetic metal layer 1. In order to prevent a leaking magnetic field from the first ferromagnetic metal layer 1 from affecting the second ferromagnetic metal layer 2, the magnetoresistance effect element may have a synthetic ferromagnetic coupling structure.

When the magnetization direction of the first ferromagnetic metal layer 1 is perpendicular to a stacking surface, it is preferable that the first ferromagnetic metal layer 1 be formed of a stacked film of Co and Pt. Specifically, the first ferromagnetic metal layer 1 can be formed by FeB (1.0 nm)/Ta (0.2 nm)/[Pt (0.16 nm)/Co (0.16 nm)]$_4$/Ru (0.9 nm)/[Co (0.24 nm)/Pt (0.16 nm)]$_6$ sequentially from the nonmagnetic layer 3 side.

Ferromagnetic materials, particularly, soft magnetic materials, can be used as the material of the second ferromagnetic metal layer 2. For example, a metal selected from a group consisting of Cr, Mn, Co, Fe, and Ni, an alloy including one type of these metals, or an alloy including these metals and at least one element of B, C, and N can be used as the material of the second ferromagnetic metal layer 2. Specific examples of the second ferromagnetic metal layer 2 include Co—Fe, Co—Fe—B, and Ni—Fe.

When the magnetization direction of the second ferromagnetic metal layer 2 is perpendicular to the stacked surface, it is preferable that the thickness of the second ferromagnetic metal layer 2 be set to 2.5 nm or less. In the interface between the second ferromagnetic metal layer 2 and the nonmagnetic layer 3, perpendicular magnetic anisotropy can be applied to the second ferromagnetic metal layer 2. Since the perpendicular magnetic anisotropy of the second ferromagnetic metal layer 2 is decreased by increasing the thickness of the second ferromagnetic metal layer 2, it is preferable that the thickness of the second ferromagnetic metal layer 2 be small.

Know materials can be used for the nonmagnetic layer 3.

For example, when the nonmagnetic layer 3 is formed of an insulator (when the nonmagnetic layer is a tunnel barrier layer), $Al_2O_3$, $SiO_2$, MgO, and $MgAl_2O_4$ can be used as the material thereof. In addition, materials in which some of Al, Si, or Mg is replaced with Zn, Be, or the like can be used for the nonmagnetic layer 3. Among these materials, MgO and $MgAl_2O_4$ are materials capable of realizing coherent tunneling and thus can efficiently inject spins into the second ferromagnetic metal layer 2.

When the nonmagnetic layer 3 is formed of a metal, Cu, Au, Ag, or the like can be used as the material thereof.

The magnetoresistance effect element 10 may include another layer. For example, the magnetoresistance effect element 10 may include a base layer on the surface of the second ferromagnetic metal layer 2 opposite to the nonmagnetic layer 3 or may include a cap layer on the surface of the first ferromagnetic metal layer 1 opposite to the nonmagnetic layer 3.

It is preferable that the layer disposed between the spin-orbit torque wiring 20 and the magnetoresistance effect element 10 do not scatter spins diffusing from the spin-orbit torque wiring 20. For example, it is known that silver, copper, magnesium, and aluminum have a long spin diffusion length of 100 nm or more and do not easily scatter spins.

It is preferable that the thickness of the layer be equal to or less than a spin diffusion length of a material of the layer. When the thickness of the layer is equal to or less than the spin diffusion length, spins diffusing from the spin-orbit torque wiring 20 can be satisfactorily transferred to the magnetoresistance effect element 10.

<Spin-Orbit Torque Wiring>

The spin-orbit torque wiring 20 extends in the x direction. The spin-orbit torque wiring 20 is connected to one surface of the second ferromagnetic metal layer 2 in the z direction. The spin-orbit torque wiring 20 may be directly connected to the second ferromagnetic metal layer 2 or may be connected thereto via another layer.

The spin-orbit torque wiring 20 is formed of a material in which a net spin current is generated due to a spin Hall effect when a current flows therein. Such a material has only to have a configuration in which a net spin current is generated in the spin-orbit torque wiring 20. Accordingly, the spin-orbit torque wiring 20 is not limited to a case in which it is formed of a single element, but may include a part formed of a material in which a net spin current is generated and a part formed of a material in which a net spin current is not generated.

The spin Hall effect is a phenomenon in which a net spin current is induced in a direction perpendicular to the direction of a current on the basis of a spin-orbit interaction when the current flows in a material.

Figure 2:
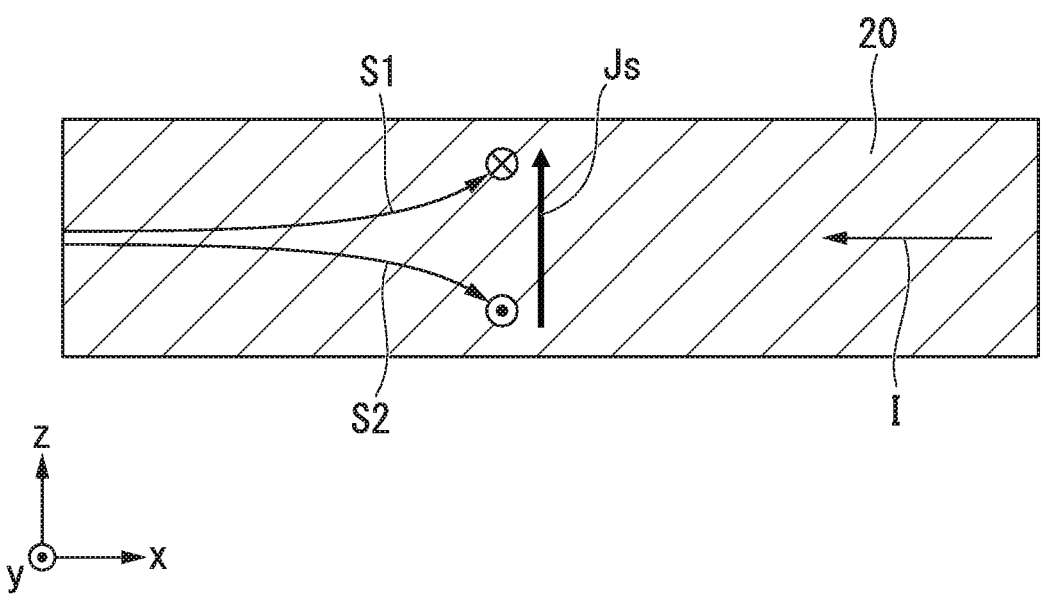
FIG. 2 is a schematic diagram showing a spin Hall effect.

FIG. 2 is a schematic diagram showing a spin Hall effect. FIG. 2 is a sectional view taken in the x direction of the spin-orbit torque wiring 20 shown in FIG. 1. A mechanism in which a net spin current is generated due to the spin Hall effect will be described below with reference to FIG. 2.

As shown in FIG. 2, when a current I flows in the extending direction of the spin-orbit torque wiring 20, a first spin S1 oriented to a depth side and a second spin S2 oriented to a front side are turned in directions perpendicular to the direction of the current. A normal Hall effect and a spin Hall effect are common in that moving (migrating) electric charges (electrons) turn their moving (migrating) directions. On the other hand, charged particles moving in a magnetic field turn their moving directions with a Lorentz force in the normal Hall effect, but electrons move (a current flows) without a magnetic field and turn their moving directions in the spin Hall effect, and thus both effects are greatly different from each other.

In a nonmagnetic material (a material other than a ferromagnetic material), since the number of electrons with the first spin S1 and the number of electrons with the second spin S2 are the same, the number of electrons with the first spin S1 which is oriented upward and the number of electrons with the second spin S2 which is oriented downward are the same. Accordingly, a current as a net flow of electric charges is zero. A spin current not accompanied with a current is particularly referred to as a net spin current.

When a current flows in a ferromagnetic material, the first spin S1 and the second spin S2 are also turned in the opposite directions. On the other hand, in a ferromagnetic material, one of the number of electrons with the first spin S1 and the number of electrons with the second spin S2 is extremely larger and thus a net current of electric charges is generated (a voltage is generated). Accordingly, a material including only a ferromagnetic material is not used as the material of the spin-orbit torque wiring 20.

Here, when an electron flow with the first spin S1 is defined as $J\uparrow$, an electron flow with the second spin S2 is defined as $J\downarrow$, and a spin current is defined as $J_S$, the spin current $J_S$ is defined as $J_S = J\uparrow - J\downarrow$. In FIG. 2, the spin current $J_S$ flows upward as a net spin current in FIG. 2. Here, the spin current $J_S$ is a flow of electrons with polarizability of 100%.

In FIG. 1, when a ferromagnetic material is brought into contact with the top surface of the spin-orbit torque wiring 20, the net spin current diffuses and flows into the ferromagnetic material. That is, spins are injected into the magnetoresistance effect element 10.

The spin-orbit torque wiring 20 may include a nonmagnetic heavy metal. Here, a heavy metal is used with a meaning of a metal having a specific weight equal to or greater than that of yttrium. The spin-orbit torque wiring 20 may include only a nonmagnetic heavy metal.

It is preferable that the nonmagnetic heavy metal be a nonmagnetic heavy metal having a d electron or an f electron at the outermost shell and having a large atomic number of 39 or greater. Such a nonmagnetic heavy metal has a great spin-orbit interaction that causes the spin Hall effect. The spin-orbit torque wiring 40 may be formed of only a nonmagnetic metal having a d electron or an f electron at the outermost shell and having a large atomic number of 39 or greater.

In general, when a current flows in a metal, all electrons moves in the opposite direction of the current regardless of the spin directions thereof. On the other hand, a nonmagnetic metal having a d electron or an f electron at the outermost shell and having a large atomic number of 39 or greater has a great spin-orbit interaction and a direction in which electrons moves due to the spin Hall effect depends on the spin direction of the electrons. Accordingly, the nonmagnetic metal having a d electron or an f electron at the outermost shell and having a large atomic number of 39 or greater is likely to generate a net spin current $J_S$.

The spin-orbit torque wiring 20 may include a magnetic metal. A magnetic metal refers to a ferromagnetic metal or an antiferromagnetic metal. When a small amount of magnetic metal is included in a nonmagnetic metal, the spin-orbit interaction is enhanced and a spin current generation efficiency for a current flowing in the spin-orbit torque wiring 20 is increased. The spin-orbit torque wiring 20 may be formed of only an antiferromagnetic metal.

The spin-orbit interaction is caused by an internal magnetic field specific to the material of the spin-orbit torque wiring and a net spin current is also generated in a nonmagnetic material. When a small amount of magnetic metal is added to the material of the spin-orbit torque wiring, the magnetic metal scatters electron spins flowing therein and the spin current generation efficiency is improved. However, when the amount of magnetic metal added thereto is excessively large, the generated net spin current is scattered by the added magnetic metal and the spin current decreases as a result. Accordingly, it is preferable that a mole ratio of the added magnetic metal be much smaller than a mole ratio of a major component of a net spin generating part in the spin-orbit torque wiring. As a guide, it is preferable that the mole ratio of the magnetic metal added thereto be equal to or less than 3%.

The spin-orbit torque wiring 20 may include a topological insulator. The spin-orbit torque wiring 20 may be formed of only a topological insulator. A topological insulator is a material which includes an insulator or a high-resistance material therein but in which a spin-polarized metal state is formed on the surface thereof. In this material, an internal magnetic field or the like such as a spin-orbit interaction is generated. Accordingly, a new topological phase appears due to an effect of the spin-orbit interaction without an external magnetic field. This is a topological insulator, which can generate a net spin current due to a strong spin-orbit interaction and breakdown of inversion symmetry at an edge with high efficiency.

For example, SnTe, $Bi_{1.5}Sb_{0.5}Te_{1.7}Se_{1.3}$, TlBiSe$_2$, Bi$_2$Te$_3$, or (Bi1−xSb$_x$)$_2$Te$_3$ can be preferably used as the topological insulator. This topological insulator can generate a spin current with high efficiency.

The spin-current magnetization rotational element 100 may further include an element other than the magnetoresistance effect element 10 and the spin-orbit torque wiring 20. For example, the spin-current magnetization rotational element may further include a substrate serving as a support. The substrate preferably has good flatness and, for example, Si or AlTiC can be used as the material thereof.

(Principle of Spin-Current Magnetization Rotational Element)

The principle of the spin-current magnetization rotational element 100 and a specific configuration of the magnetoresistance effect element 10 will be described below.

Figure 3:
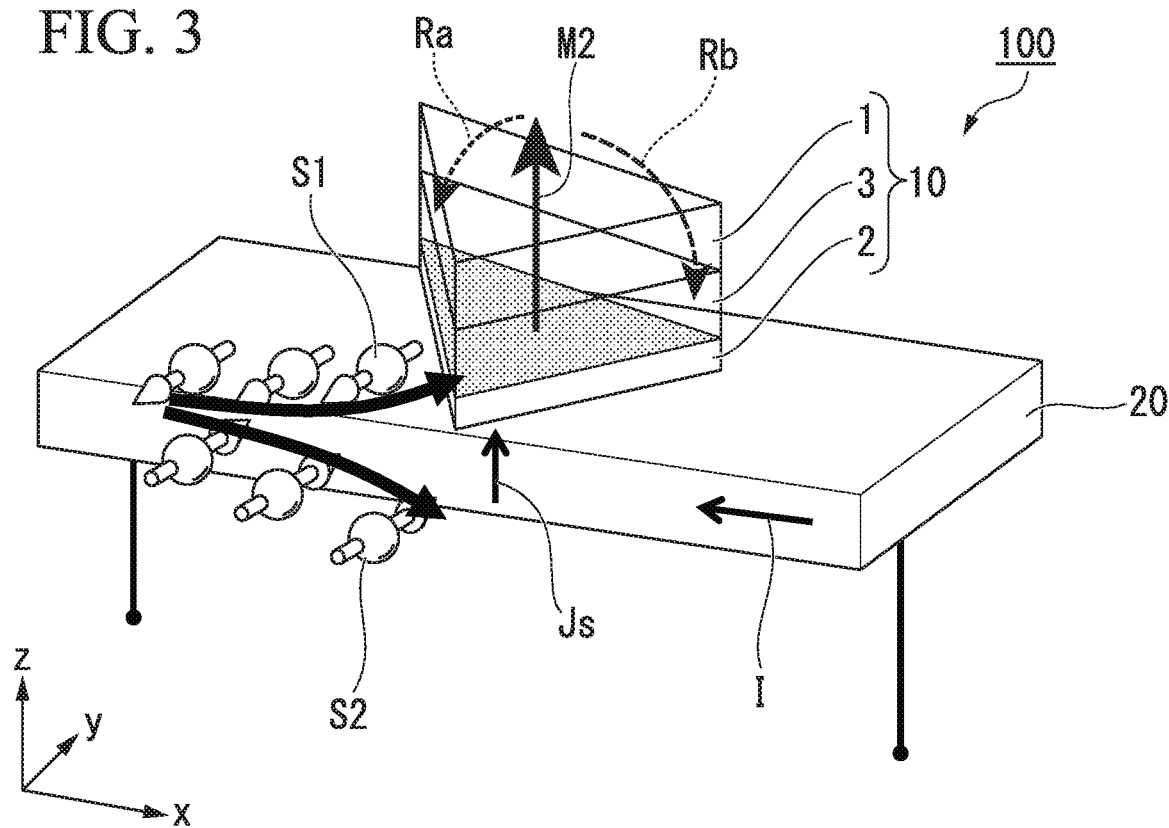
FIG. 3 is a schematic diagram showing an operation of the spin-current magnetization rotational element.

FIG. 3 is a schematic diagram showing the operation of a spin-current magnetization rotational element. As shown in FIG. 3, when a current I is applied to the spin-orbit torque wiring 20, the first spin S1 and the second spin S2 are turned due to the spin Hall effect. As a result, a net spin current $J_S$ is generated in the z direction.

The magnetoresistance effect element 10 is disposed in the z direction of the spin-orbit torque wiring 20. Accordingly, spins are injected into the second ferromagnetic metal layer 2 of the magnetoresistance effect element 10 from the spin-orbit torque wiring 20. The injected spins give a spin orbit torque (SOT) to magnetization M2 of the second ferromagnetic metal layer 2, and the magnetization M2 is reversed. In FIG. 3, the magnetization M2 of the second ferromagnetic metal layer 2 is schematically shown as one magnetization located at the center of gravity of the magnetoresistance effect element.

In the spin-current magnetization rotational element 100 shown in FIG. 3, the direction of the spin injected into the magnetoresistance effect element 10 from the spin-orbit torque wiring 20 is oriented in the y direction. On the other hand, the second ferromagnetic metal layer 2 has a uniform thickness and the direction of the magnetization M2 of the second ferromagnetic metal layer 2 is oriented in the z direction. That is, the direction of the spin injected into the magnetoresistance effect element 10 and the direction of the magnetization M2 of the second ferromagnetic metal layer 2 are perpendicular to each other. Here, "perpendicular" refers to "perpendicular" in a theoretical system in which fluctuation of heat or the like is ignored. Actually, this case includes a case in which both the magnetization M2 and the injected spin fluctuate and are not completely perpendicular to each other.

When the direction of the injected spin and the direction of the magnetization M2 are perpendicular to each other, the magnetization m2 is not theoretically affected by the injected spin. Accordingly, in order to reverse the magnetization M2, it is necessary to disturb symmetry of the magnetization M2 with respect to the injected spin (to cause "symmetry breakdown"). The spin-current magnetization rotational element 100 shown in FIG. 3 causes "symmetry breakdown" using the shape anisotropy of the magnetoresistance effect element 10. This will be specifically described below.

Figure 4:
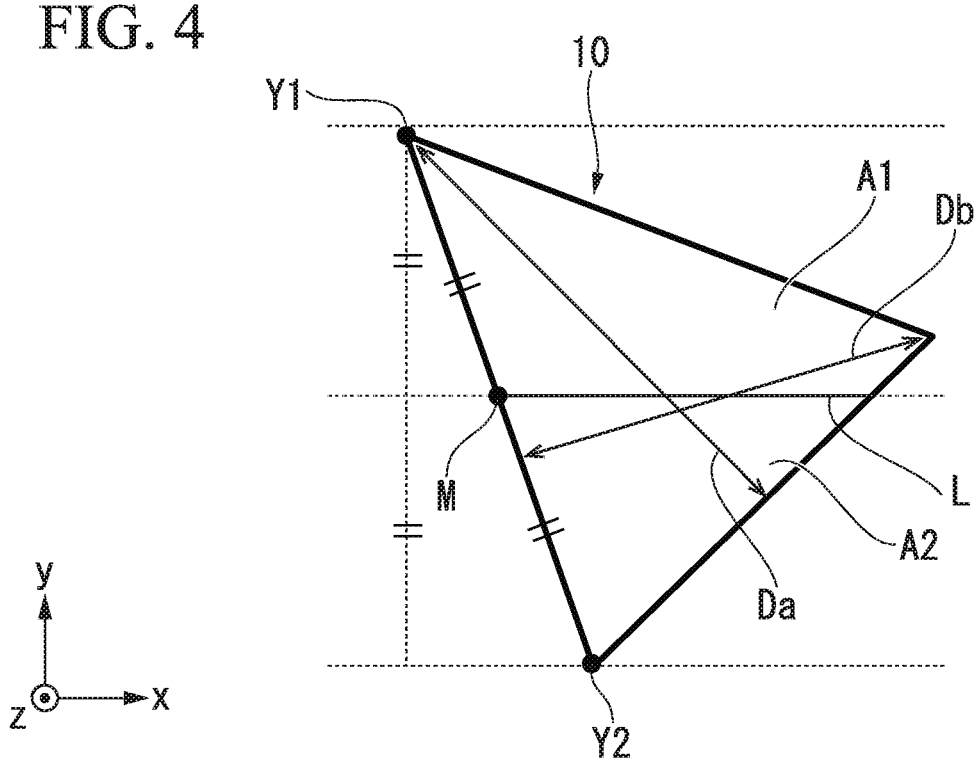
FIG. 4 is a plan view of a magnetoresistance effect element when seen in a z direction.

FIG. 4 is a plan view of a magnetoresistance effect element when seen in the z direction. The magnetoresistance effect element 10 shown in FIG. 4 has a major axis direction Da and a minor axis direction Db and has shape anisotropy. Accordingly, the magnetoresistance effect element 10 has different magnitudes of demagnetizing fields in the major axis direction Da and the minor axis direction Db and has a demagnetizing field distribution.

A demagnetizing field is a magnetic field in a reverse direction which is generated in a ferromagnetic material due to a magnetic pole formed at an end of a magnetic material. The magnitude of the demagnetizing field increases as the polarizability of the magnetic pole increases and as a distance between magnetic poles decreases. In the magnetoresistance effect element 10 shown in FIG. 4, the magnitude of the demagnetizing field in the minor axis direction Db is greater than the magnitude of the demagnetizing field in the major axis direction Da.

The demagnetizing field generates a restoring force for restoring the magnetization M2 to an original state when the magnetization M2 starts its rotation. The restoring force is a reaction to the magnetization rotation, and the magnetization M2 has more difficulty in rotation as the restoring force becomes larger.

Rotation easiness of the magnetization M2 is different between a rotation direction Ra along the major axis direction Da (hereinafter referred to as a first rotation direction) shown in FIG. 3 and a rotation direction Rb along the minor axis direction Db (hereinafter referred to as a second rotation direction) shown in FIG. 3. The magnitude of the restoring force acting when the magnetization M2 of the second ferromagnetic metal layer 2 rotates is larger in the minor axis direction Db. Accordingly, the magnetization M2 rotates more easily in the first rotation direction Ra than in the second rotation direction Rb. That is, the first rotation direction is an easy magnetization rotational direction of the magnetoresistance effect element 10.

The length in the major axis direction Da of the magnetoresistance effect element 10 preferably ranges from 0.01 μm to 0.12 μm, and the length in the minor axis direction Db preferably ranges from 0.005 μm to 0.06 μm. When the magnitude of the magnetoresistance effect element 10 is large, a magnetic domain is formed in the second ferromagnetic metal layer 2. When a magnetic domain is formed, magnetization stability of the second ferromagnetic layer decreases. The length in the major axis direction Da of the magnetoresistance effect element 10 is preferably equal to or greater than double the length in the minor axis direction Db and more preferably equal to or greater than four times the length. When the length ratio of the major axis direction Da and the minor axis direction Db of the magnetoresistance effect element 10 is within the range, a satisfactory difference in restoring force due to a demagnetizing field is obtained.

In the spin-current magnetization rotational element 100 shown in FIG. 3, "symmetry breakdown" is caused in view of the magnitude of the restoring force acting on the magnetization M2. When the injected spin and the magnetization M2 are theoretically perpendicular to each other, the magnetization M2 actually fluctuates slightly due to heat or the like and thus an SOT acts on the magnetization M2. When the SOT is greater than the restoring force acting in the easy magnetization rotational direction of the magnetization m2, the magnetization M2 is reversed without applying an external magnetic field or the like thereto.

Figure 5:
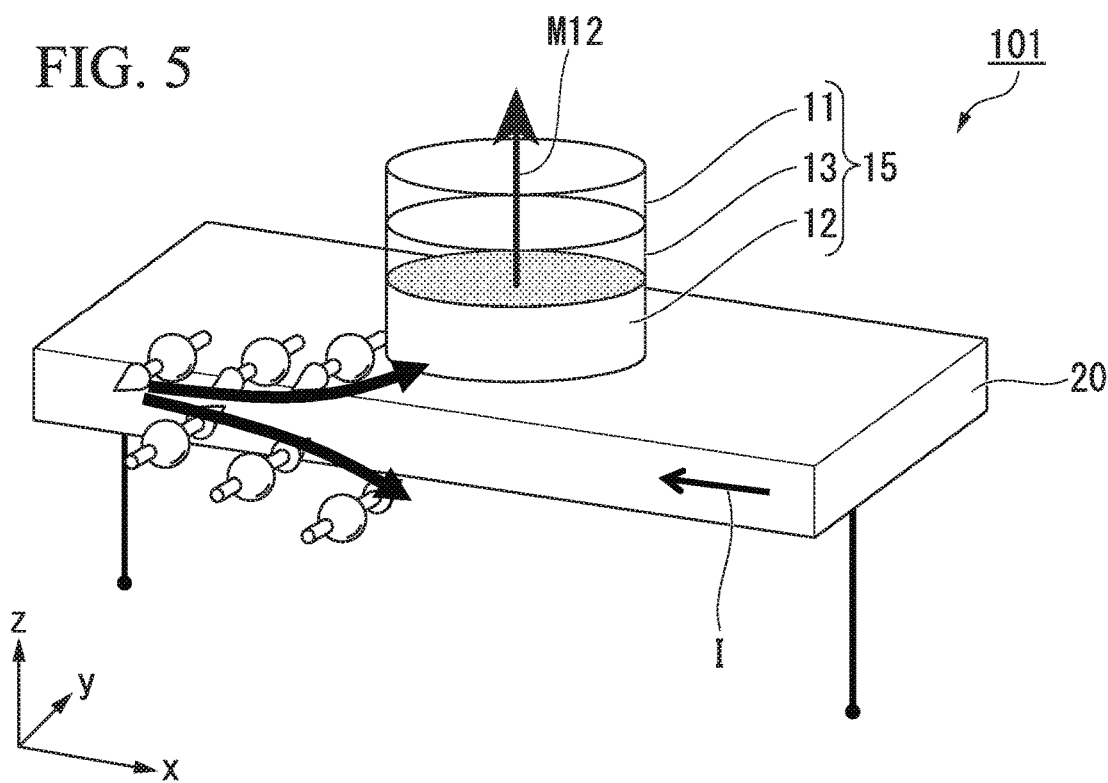
FIG. 5 is a diagram schematically showing a spin-current magnetization rotational element including a magnetoresistance effect element not having shape anisotropy.

FIG. 5 is a diagram schematically showing a spin-current magnetization rotational element 101 including a magnetoresistance effect element 15 not having shape anisotropy. The magnetoresistance effect element 15 shown in FIG. 5 is the same as the magnetoresistance effect element 10 shown in FIG. 3 in that a structure in which a nonmagnetic layer 13 is interposed between a first ferromagnetic metal layer 11 and a second ferromagnetic metal layer 12 is employed, but is different from the magnetoresistance effect element 10 in that a planar shape when seen in the z direction is circular. In FIG. 5, magnetization of the second ferromagnetic metal layer 12 is schematically shown as one piece of magnetization M12 located at the center of gravity of the magnetoresistance effect element.

The magnetoresistance effect element 15 shown in FIG. 5 does not have shape anisotropy and does not have anisotropy in the magnitude of a demagnetizing field. Accordingly, the magnitude of the restoring force acting when the magnetization M12 starts its rotation is uniform in any direction and the restoring force is balanced. That is, a rotating force larger than the restoring force cannot be applied with only the SOT acting on the magnetization M12 when the magnetization M12 fluctuates slightly due to heat or the like, and thus the magnetization M12 cannot be reversed.

When the magnetization M12 in the spin-current magnetization rotational element 101 shown in FIG. 5 is reversed, it is necessary to generate "symmetry breakdown" by applying an external magnetic field or the like and to give a rotating force larger than the restoring force.

In this way, in the spin-current magnetization rotational element 100 according to this embodiment, "symmetry breakdown" is generated due to the shape anisotropy. As a result, a demagnetizing field distribution is formed in the magnetoresistance effect element 10 and the magnitude of the restoring force acting on the magnetization differs depending on the direction. That is, an easy magnetization rotational direction is formed, and magnetization reversal can be performed even when the SOT acting thereon is small. That is, it is possible to perform magnetization reversal using the SOT without applying an external magnetic field.

Here, spins generated due to the spin Hall effect in the spin-orbit torque wiring 20 are oriented along the outer surface of the spin-orbit torque wiring 20. That is, spins injected into the magnetoresistance effect element 10 from the spin-orbit torque wiring 20 are oriented in the y direction. Accordingly, the magnetoresistance effect element 10 needs to have shape anisotropy in a direction intersecting the x direction in a plan view seen from the z direction.

Figure 6:
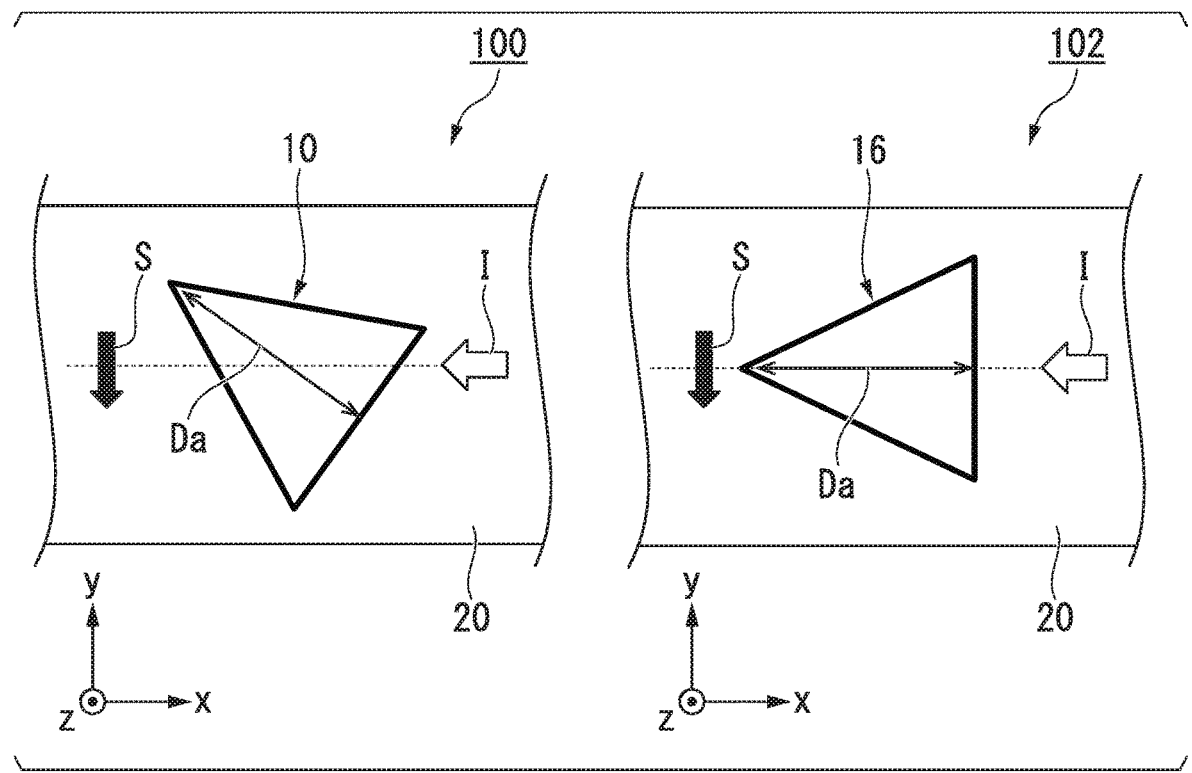
FIG. 6 is a diagram schematically showing an influence of symmetry in a y direction of a magnetoresistance effect element on magnetization reversal.

FIG. 6 is a diagram schematically showing an influence of symmetry in the y direction of the magnetoresistance effect element to magnetization reversal. FIG. 6(a) shows a spin-current magnetization rotational element 100 in which the magnetoresistance effect element 10 has shape anisotropy in a direction intersecting the x direction, and FIG. 6(b) shows a spin-current magnetization rotational element 102 in which a magnetoresistance effect element 16 has shape anisotropy in the x direction. In FIG. 6, a white arrow indicates a direction of a current I flowing in the spin-orbit torque wiring 20, and a black arrow indicates a direction of a spin injected into the magnetoresistance effect elements 10 and 16.

In the magnetoresistance effect element 16 shown in FIG. 6(b), a restoring force acting in a direction parallel to the major axis direction Da is the smallest. Accordingly, magnetization of a second ferromagnetic metal layer of the magnetoresistance effect element 16 can rotate easily in the major axis direction Da. That is, the easy magnetization rotational direction is the x direction.

On the other hand, the direction of the magnetization injected into the magnetoresistance effect element 16 is the y direction, and the direction in which the SOT acts strongly is the y direction. That is, the direction in which the magnetization can rotate easily and the direction in which the SOT acts strongly are perpendicular to each other, and the SOT does not act on the magnetization reversal.

On the other hand, in the magnetoresistance effect element 10 shown in FIG. 6(a), the restoring force acting in the direction along the major axis direction Da is the smallest. Accordingly, the magnetization of the second ferromagnetic metal layer of the magnetoresistance effect element 10 is likely to rotate in the major axis direction Da. That is, an easy magnetization rotation direction intersects the x direction and has a y-direction component. Accordingly, the magnetization can be affected by the SOT acting in the y direction. That is, the SOT can act on the magnetization reversal efficiently and the magnetization can be reversed without applying an external force such as an external magnetic field.

As described above, it is preferable that a planar shape of the magnetoresistance effect element 10 when seen in the z direction have anisotropy in the y direction. More specifically, in a planar shape of the magnetoresistance effect element 10 when seen in the z direction, it is preferable that two areas partitioned by a line segment passing through a midpoint between two points separated farthest in the y direction and parallel to the x direction be different from each other in area. This will be specifically described below with reference to FIG. 4.

As shown in FIG. 4, in a plan view of the magnetoresistance effect element 10 when seen in the z direction, two points separated farthest in the y direction from each other are defined as a first point Y1 and a second point Y2 and a midpoint therebetween is defined as a midpoint M. A line segment L parallel to the x direction is drawn through the midpoint M. The line segment L partitions the planar shape of the magnetoresistance effect element 10 when seen in the z direction into two areas. The two areas partitioned by the outer circumference of the magnetoresistance effect element 10 and the line segment L are defined as a first area A1 and a second area A2.

When the first area A1 and the second area A2 are different in area, the magnetoresistance effect element 10 is asymmetric in the y direction. That is, it can be said that the magnetoresistance effect element 10 has "symmetry breakdown" in the y direction. When "symmetry breakdown" occurs in the y direction, spins injected by the magnetoresistance effect element 10 as described above apply an SOT to the magnetization of the second ferromagnetic metal layer to cause magnetization reversal.

As a degree of "symmetry breakdown" increases, the magnetization reversal is more likely to occur. When an area difference between the first area A1 and the second area A2 increases, the degree of "symmetry breakdown" of the magnetoresistance effect element 10 as a whole increases.

The areas of the first area A1 and the second area A2 can be calculated as follows. First, a scanning electron microscope image (a SEM image) of the magnetoresistance effect element 10 is captured in the z direction. The captured SEM image is partitioned by the line segment L, and the number of pixels of each partitioned image is counted. When the counted number of pixels varies by 5% or more, it can be determined that the areas of the first area A1 and the second area A2 are different from each other.

It is preferable that the planar shape of the magnetoresistance effect element 10 when seen in the z direction be a polygon having 2n+1 (where n is a natural number) apexes. The polygon is not limited to the triangle shown in FIG. 4.

When the planar shape of the magnetoresistance effect element 10 when seen in the z direction is a distorted and complicated shape, parts having different restoring forces are formed in multiple directions and magnetization stability decreases. When the magnetization stability decreases, reliability in long-term storage of data decreases. Accordingly, it is preferable that the magnetoresistance effect element 10 have a shape having shape anisotropy and high stability. In view of easy manufacturing of the magnetoresistance effect element 10, it is preferable that the planar shape in the z direction be a triangle.

It is preferable that all direction vectors from the center of gravity of the polygon to the apexes be different from the direction of the current flowing in the spin-orbit torque wiring 20. That is, it is preferable that line segments drawn from the center of gravity of the polygon to the apexes do not be parallel to the x direction. When a line segment drawn from the center of gravity of the polygon to an apex is parallel to the x direction as shown in FIG. 6(b), there is high likelihood that "symmetry breakdown" will not occur in the y direction.

Figure 7:
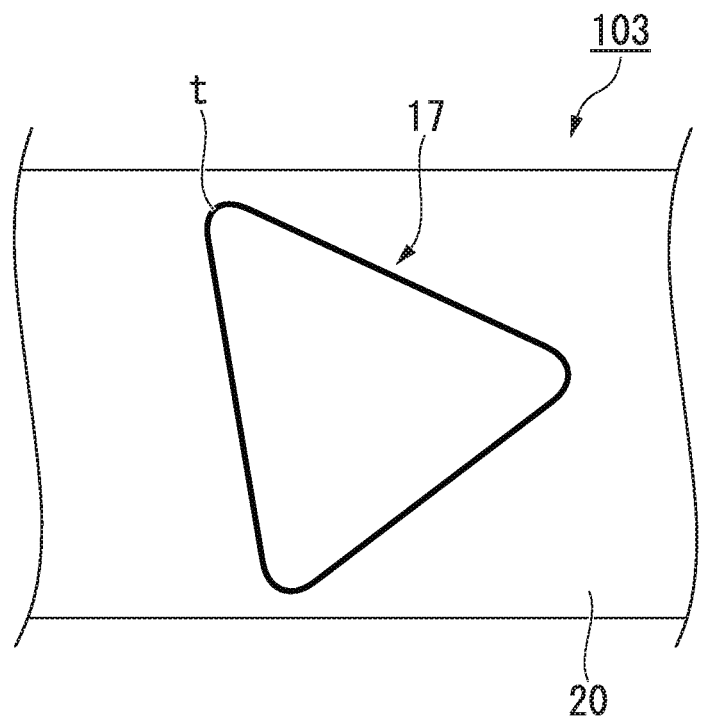
FIG. 7 is a plan view of a spin-current magnetization rotational element in which a planar shape of a magnetoresistance effect element is polygonal and apexes of the polygon are curved when seen in the z direction.

As shown in FIG. 7, it is preferable that the apexes t of a polygon be curved.

FIG. 7 is a plan view of a spin-current magnetization rotational element 103 in which a planar shape of a magnetoresistance effect element 17 is a polygon and apexes t of the polygon are curved when seen in the z direction.

In general, a magnetic flux in a nonuniform part such as an interface is likely to be pinned. Accordingly, apexes t of a polygon are particularly nonuniform and magnetization therein is likely to be pinned. When the magnetization is pinned, magnetization reversal is not likely to occur.

When the apexes t are curved, shape nonuniformity is relaxed and a pinning force (a pin force) decreases. That is, it is possible to more easily reverse magnetization of a free layer of a magnetoresistance effect element.

In the magnetoresistance effect element 10 (see FIG. 1), the first ferromagnetic metal layer 1 and the second ferromagnetic metal layer 2 may be an in-plane magnetization film in which a magnetization direction is an in-plane direction parallel to the layer or a perpendicular magnetization film in which a magnetization direction is perpendicular to the layer.

As described above, in the spin-current magnetization rotational element 100 according to this embodiment, the direction of spins injected into the magnetoresistance effect element 10 and the direction of the magnetization M2 of the second ferromagnetic metal layer 2 are perpendicular to each other. The direction of the magnetization M2 of the second ferromagnetic metal layer 2 has only to have a component perpendicular to the direction of injected spins and does not have to be "perpendicular" thereto. That is, the direction of spins injected into the magnetoresistance effect element 10 and the direction of the magnetization M2 of the second ferromagnetic metal layer 2 may "intersect" each other. On the other hand, the direction of injected spins is oriented along the outer surface of the spin-orbit torque wiring 20 and thus cannot be changed. Accordingly, it is preferable that the direction of the magnetization M2 of the second ferromagnetic metal layer 2 be parallel to the x direction or the z direction. When the direction of spins injected into the magnetoresistance effect element 10 and the direction of the magnetization M2 of the second ferromagnetic metal layer 2 are perpendicular to each other, it is possible to more efficiently apply an SOT to the magnetization M2.

In the magnetoresistance effect element 10 according to this embodiment, it is preferable that the direction of the magnetization M2 of the second ferromagnetic metal layer 2 be parallel to the z direction. That is, it is preferable that the second ferromagnetic metal layer 2 be a perpendicular magnetization film. When the ferromagnetic material constituting the magnetoresistance effect element 10 is a perpendicular magnetization film, it is possible to easily decrease the size of the magnetoresistance effect element.

The magnetization M2 is oriented with an influence of an interface with the second ferromagnetic metal layer 2. Accordingly, in order to orient the magnetization M2 uniformly in the z direction, it is preferable that the thickness of the second ferromagnetic metal layer 2 be uniform. Here, "uniform" means that there is no thickness variation of ±10% from an average value of the thicknesses of the second ferromagnetic metal layer 2 measured at ten arbitrary points in an xy plane.

As described above, in the spin-current magnetization rotational element according to this embodiment, it is possible to reverse magnetization of a second ferromagnetic metal layer (a free layer) without applying an external force such as an external magnetic field. This is because anisotropy of a restoring force is formed with the shape anisotropy and "symmetry breakdown" occurs in the magnetoresistance effect element.

(Method of Manufacturing Spin-Current Magnetization Rotational Element)

A method of manufacturing a spin-current magnetization rotational element will be described below.

A spin-current magnetization rotational element has a stacking order which varies depending on whether a magnetoresistance effect element has a top pin structure or a bottom pin structure. In the top pin structure, as shown in FIG. 1, a first ferromagnetic metal layer 1 which is a fixed layer is formed above in the z direction. Accordingly, the magnetoresistance effect element is manufactured after a spin-orbit torque wiring 20 is formed on a substrate. In the bottom pin structure, the spin-orbit torque wiring is formed after the magnetoresistance effect element is manufactured. Since both cases are different in only the stacking order, the top pin structure will be described below.

First, a spin-orbit torque wiring is formed on a substrate serving as a support. The spin-orbit torque wiring can be formed using known film formation means such as sputtering.

Subsequently, a magnetoresistance effect element is manufactured. The magnetoresistance effect element can be manufactured using known film formation means such as sputtering. When the magnetoresistance effect element is a TMR element, a tunnel barrier layer is obtained, for example, by stacking a metal film and then oxidizing the resultant. As a specific example, a metal film containing magnesium, aluminum, or divalent cations of a plurality of nonmagnetic elements with a thickness of 0.4 nm to 2.0 nm is first formed on the second ferromagnetic metal layer by sputtering. Subsequently, plasma oxidization or natural oxidization by introduction of oxygen is performed on the formed metal film and then heat treatment is performed thereon. Examples of the film formation method include a deposition method, a laser ablation method, and an MBE method in addition to the sputtering method.

Processing means such as photolithography can be used as a method of shaping the magnetoresistance effect element in a predetermined shape. First, the magnetoresistance effect element is stacked and then a resist is applied on the surface of the magnetoresistance effect element opposite to the spin-orbit torque wiring. Then, the resist of a predetermined part is cured and the resist of an unnecessary part is removed. The part in which the resist has been cured serves as a protective film of the magnetoresistance effect element.

The part in which the resist has been cured has a shape matching the final shape of the magnetoresistance effect element.

Treatment such as ion milling or reactive ion etching (RIE) is performed on the surface on which the protective film is formed. The part on which the protective film is not formed is removed and the magnetoresistance effect element with a predetermined shape is obtained.

A method of curing the resist in a predetermined shape will be specifically described below.

As a first method, a method of exposing the resist to light using a mask can be used. For example, a positive resist is used and a photo mask is disposed on a part which is desired to be cured. By performing exposing using the photo mask, the resist can be shaped in a predetermined shape.

Figure 8:
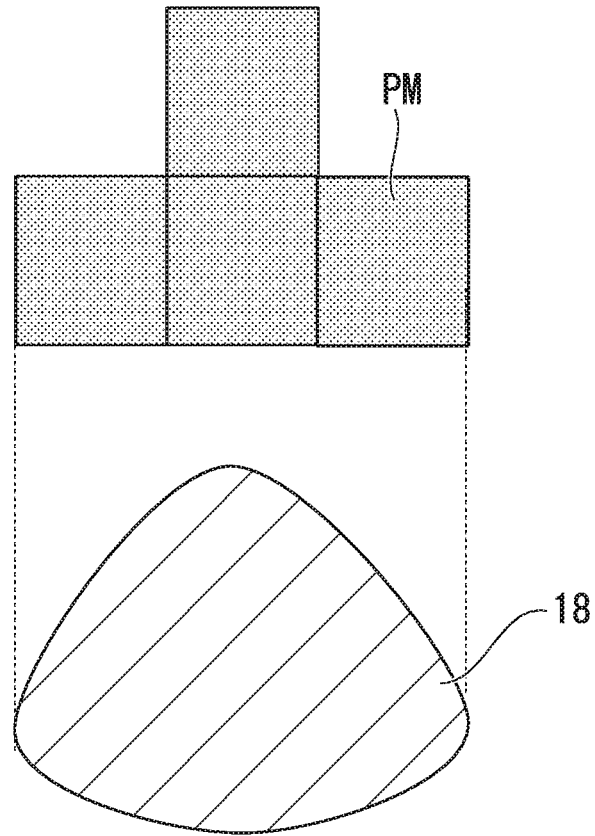
FIG. 8 is a diagram showing correspondence between a shape of a photo mask and a planar shape of a resultant magnetoresistance effect element when seen in the z direction.

A decrease in element size is required for the magnetoresistance effect element for the purpose of an increase in a degree of integration. Accordingly, the size of the magnetoresistance effect element may approach an exposing resolution limit. In this case, as shown in FIG. 8, the resist is cured in a predetermined shape in combination of a plurality of photo masks PM formed in a rectangular shape. One side of one photo mask PM can be set to about several nm at the present technical level.

FIG. 8 is a diagram showing correspondence between the shape of a photo mask PM and the planar shape of a magnetoresistance effect element 18 when seen in the z direction. Even when the shape of one photo mask PM is rectangular as shown in FIG. 8, the planar shape of the magnetoresistance effect element can be formed in a polygon such as a triangle. This is because light having passed through the photo mask PM diffuses partially to cure the resist. This is also because a part at a corner is easily etched in etching such as ion milling.

As another method, the resist may be subjected to spot exposure using directive light such as a laser beam. For example, only a part which is desired to be cured is irradiated with light using a negative resist and the resist is formed in a predetermined shape. In this case, similarly, even when the shape of an exposing spot is rectangular, a triangular shape can be obtained. By performing spot exposure a plurality of times, it is possible to obtain a magnetoresistance effect element with an arbitrary shape.

The invention is not limited to the configuration and the manufacturing method of the spin-current magnetization rotational element according to the embodiment, and can be subjected to various modifications without departing from the gist of the invention.

For example, the planar shape in the z direction of the magnetoresistance effect element of the spin-current magnetization rotational element is not limited to a polygon as long as it has magnetic anisotropy in the y direction.

Figure 9:
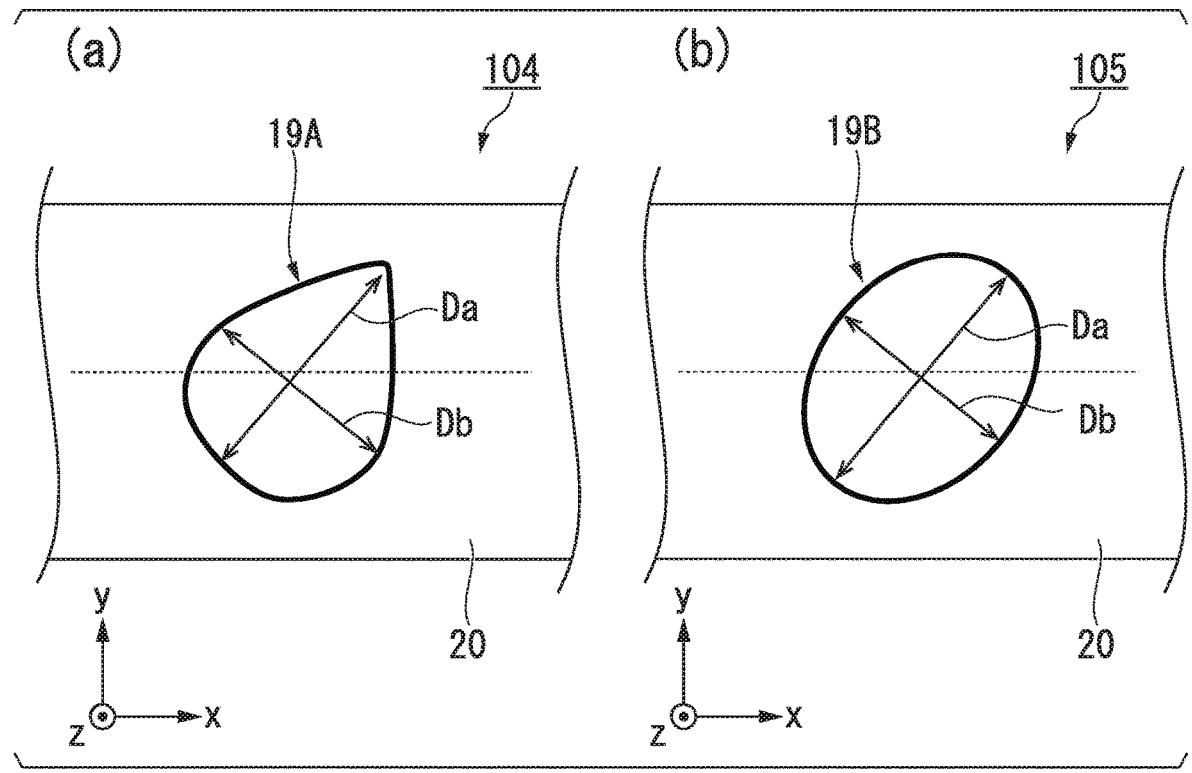
FIG. 9 is a diagram showing a planar shape of another example of the spin-current magnetization rotational element when seen in the z direction.

Like a spin-current magnetization rotational element 104 shown in FIG. 9(a), a planar shape of a magnetoresistance effect element 19A when seen in the z direction may be a droplet shape including one apex and an arc connected to the apex. Like a spin-current magnetization rotational element 105 shown in FIG. 9(b), a planar shape of a magnetoresistance effect element 19B when seen in the z direction may be an elliptical shape.

In any case, the magnetoresistance effect element has a major axis direction Da and a minor axis direction Db and also has shape anisotropy. Accordingly, the magnetoresistance effect element has a demagnetizing field distribution and the magnitude of a restoring force varies depending on a direction. The easy magnetization rotation direction in which the magnitude of the restoring force is the smallest matches the major axis direction Da. The major axis direction Da includes a y-direction component and an SOT can be made to contribute to magnetization reversal.

The spin-orbit torque wiring 20 can also have various shapes.

FIGS. 10 to 13 are schematic diagrams showing examples of a spin-orbit torque wiring, where (a) is a sectional view and (b) is a plan view.

A heavy metal which is a material capable of generating a net spin current has higher electric resistance and a larger amount of Joule heat generated when a current flows therein than a metal which is used as a normal wire. Accordingly, it is more preferable that the spin-orbit torque wiring include a part with low electric resistance in comparison with a case in which it is formed of only materials capable of generating a net spin current. That is, the spin-orbit torque wiring preferably includes a part (a spin current generating part) formed of a material capable of generating a net spin current and a part (a low-resistance part) formed of a material with lower electric resistance than the spin current generating part.

The spin current generating part has only to be formed of a material capable of generating a net spin current, and may include, for example, parts of a plurality of types of materials.

The low-resistance part can be formed of a material which is used for a normal wire. For example, aluminum silver, copper, or gold can be used. The low-resistance part has only to be formed of a material with lower electric resistance than the spin current generating part, and may include, for example, parts of a plurality of types of materials.

A net spin current may be generated in the low-resistance part. In this case, the spin current generating part and the low-resistance part can be distinguished by the materials which are described as the materials of the spin current generating part and the low-resistance part in this specification. A part which is other than the principal part generating a net spin current and which has lower electric resistance than the principal part is a low-resistance part and can be distinguished from the spin current generating part.

The spin current generating part may contain a nonmagnetic heavy metal. In this case, the spin current generating part has only to include a heavy metal capable of generating a net spin current finitely. It is preferable that the composition ratio of a heavy metal capable of generating a net spin current be much less than that of a major component of the spin current generating part or occupy the major component (for example, 90% or more) of the spin current generating part. When the heavy metal occupies the major component of the spin current generating part, it is preferable that the spin current generating part be formed of only a nonmagnetic metal having a d electron or an f electron at the outermost shell and having an atomic number of 39 or greater.

Here, when the composition ratio of the heavy metal capable of generating a net spin current is much less than that of the major component of the spin current generating part, it means that the concentration of the heavy metal in the spin current generating part containing copper as a major component is equal to or less than 10% in terms of a mole ratio. When the major component of the spin current generating part is a material other than the heavy metal, the concentration of the heavy metal in the spin current generating part is preferably equal to or less than 50% and more preferably equal to or less than 10%.

When the concentration of the heavy metal is within such a range, a scattering effect of electron spins can be effectively obtained. When the concentration of the heavy metal is low, a light metal having a smaller atomic number than the heavy metal occupies a major component of the spin current generating part. In this case, the heavy metal does not form an alloy with a light metal, but atoms of the heavy metal are assumed to be randomly dispersed in the light metal. Since a spin-orbit interaction is weak in a light metal, it is difficult to generate a net spin current due to the spin Hall effect.

However, since spins are also scattered at an interface between a light metal and a heavy metal when electrons pass through the heavy metal in the light metal, it is possible to efficiently generate a net spin current even in an area in which the concentration of the heavy metal is low. When the concentration of the heavy metal is greater than 50%, a proportion of the spin Hall effect in the heavy metal increases, but the effect at the interface between the light metal and the heavy metal decreases, whereby the resultant effect decreases. Accordingly, it is preferable that the concentration of the heavy metal be a value with which a satisfactory effect at the interface can be expected.

When the spin-orbit torque wiring includes a magnetic metal, an antiferromagnetic metal can be used for the spin current generating part in the spin-orbit torque wiring. By using the antiferromagnetic metal, an effect equivalent to that when the heavy metal is a nonmagnetic heavy metal having a d electron or an f electron at the outermost shell and having an atomic number of 39 or greater can be obtained. As the antiferromagnetic metal, for example, IrMn or PtMn can be preferably used and IrMn which is stable with respect to heat can be more preferably used.

When the spin-orbit torque wiring includes a topological insulator, the spin current generating part in the spin-orbit torque wiring can be formed of the topological insulator. For example, SnTe, $Bi_{1.5}Sb_{0.5}Te_{1.7}Se_{1.3}$, $TlBiSe_2$, $Bi_2Te_3$, or $(Bi1-xSb_x)_2Te_3$ can be preferably used as the topological insulator. This topological insulator can generate a spin current with high efficiency.

In order to allow a net spin current generated in the spin-orbit torque wiring to effectively diffuse into the magnetoresistance effect element, it is preferable that at least a part of the spin current generating part be in contact with the second ferromagnetic metal layer. When a cap layer is provided, it is preferable that at least a part of the spin current generating part be in contact with the cap layer. All the examples of the spin-orbit torque wiring shown in FIGS. 10 to 13 employ a configuration in which at least a part of the spin current generating part is in contact with the second ferromagnetic metal layer.

Figure 10:
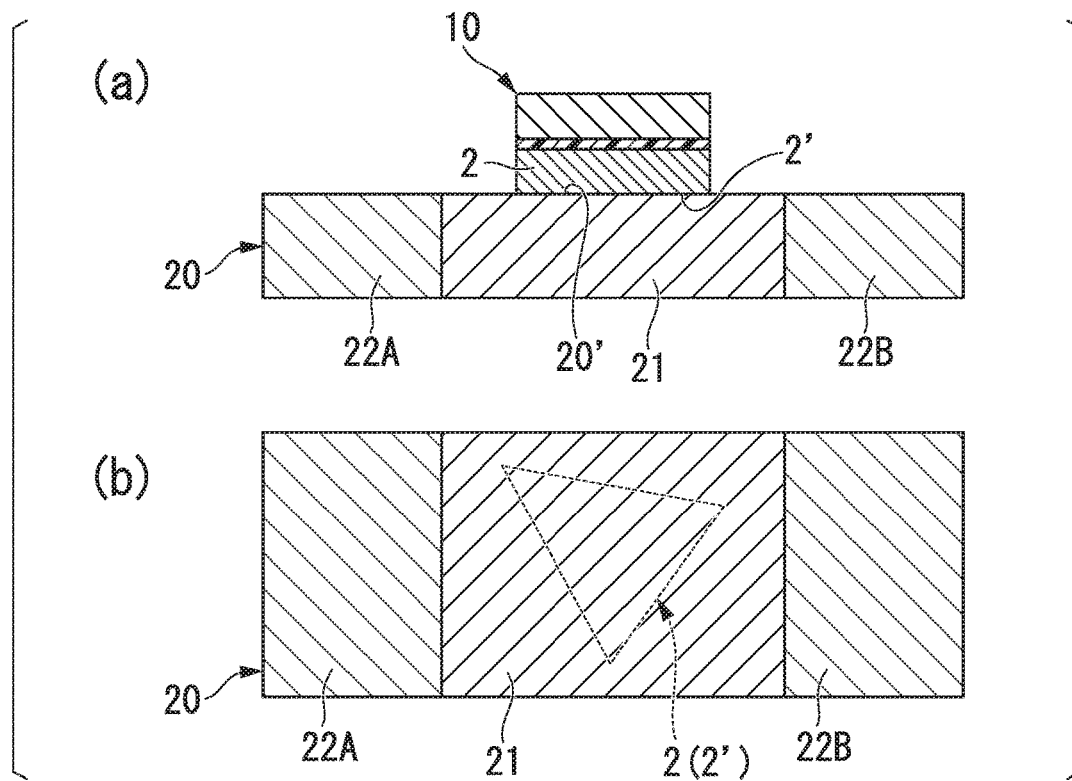
FIG. 10 is a schematic diagram showing an example of a spin-orbit torque wiring, where FIG. 10($a$) is a sectional view and FIG. 10($b$) is a plan view.

In the example shown in FIG. 10, the spin-orbit torque wiring 20 has a configuration in which the entire bonding portion 20' to the second ferromagnetic metal layer 2 is formed of a spin current generating part 21 and the spin current generating part 21 is interposed between low-resistance parts 22A and 22B.

When a spin current generating part and a low-resistance part are disposed electrically in parallel, a current flowing in the spin-orbit torque wiring is divided by a reciprocal ratio of resistance values between the spin current generating part and the low-resistance part and flows into the parts.

In order to allow the entire current flowing in the spin-orbit torque wiring to flow into the spin current generating part, it is preferable that there be no part in which the spin current generating part and the low-resistance part are disposed electrically in parallel and the spin current generating part and the low-resistance part be disposed electrically in series. It is possible to enhance efficiency in generation of a net spin current with respect to an SOT reversing current.

The spin-orbit torque wirings shown in FIGS. 10 to 13 have a configuration in which there is no part in which the spin current generating part and the low-resistance part are electrically in parallel in a plan view of the magnetoresistance effect element when seen in the stacking direction and a configuration in which efficiency in generation of a net spin current with respect to a flowing current is the highest.

In the spin-orbit torque wiring 20 shown in FIG. 10, the spin current generating part 21 overlaps to include the bonding portion 2' to the second ferromagnetic metal layer 2 in a plan view of the magnetoresistance effect element 20 when seen in the stacking direction. The part in the thickness direction of the spin-orbit torque wiring 20 in the part overlapping the magnetoresistance effect element 20 includes only the spin current generating part 21. The spin current generating part 21 is interposed between the low-resistance parts 22A and 22B in the direction in which a current flows. As a modified example of the spin-orbit torque wiring shown in FIG. 10, the spin current generating part may overlap the portion bonded to the second ferromagnetic metal layer in a plan view of the magnetoresistance effect element when seen in the stacking direction. The modified example has the same configuration as the spin-orbit torque wiring shown in FIG. 3 except this difference.

Figure 11:
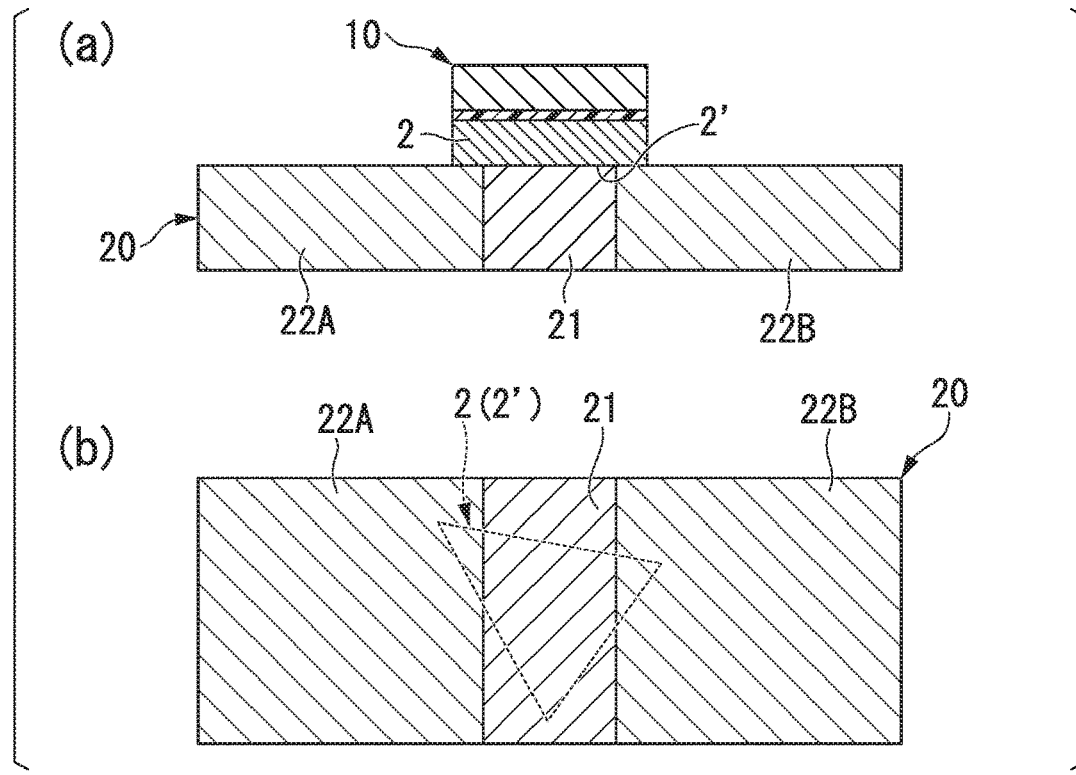
FIG. 11 is a schematic diagram showing another example of the spin-orbit torque wiring, where FIG. 11($a$) is a sectional view and FIG. 11($b$) is a plan view.

In the spin-orbit torque wiring 20 shown in FIG. 11, the spin current generating part 21 partially overlaps the bonding portion 2' to the second ferromagnetic metal layer 2 in a plan view of the magnetoresistance effect element 10 when seen in the stacking direction. The other configuration is the same as that of the spin-orbit torque wiring 20 shown in FIG. 10.

Figure 12:
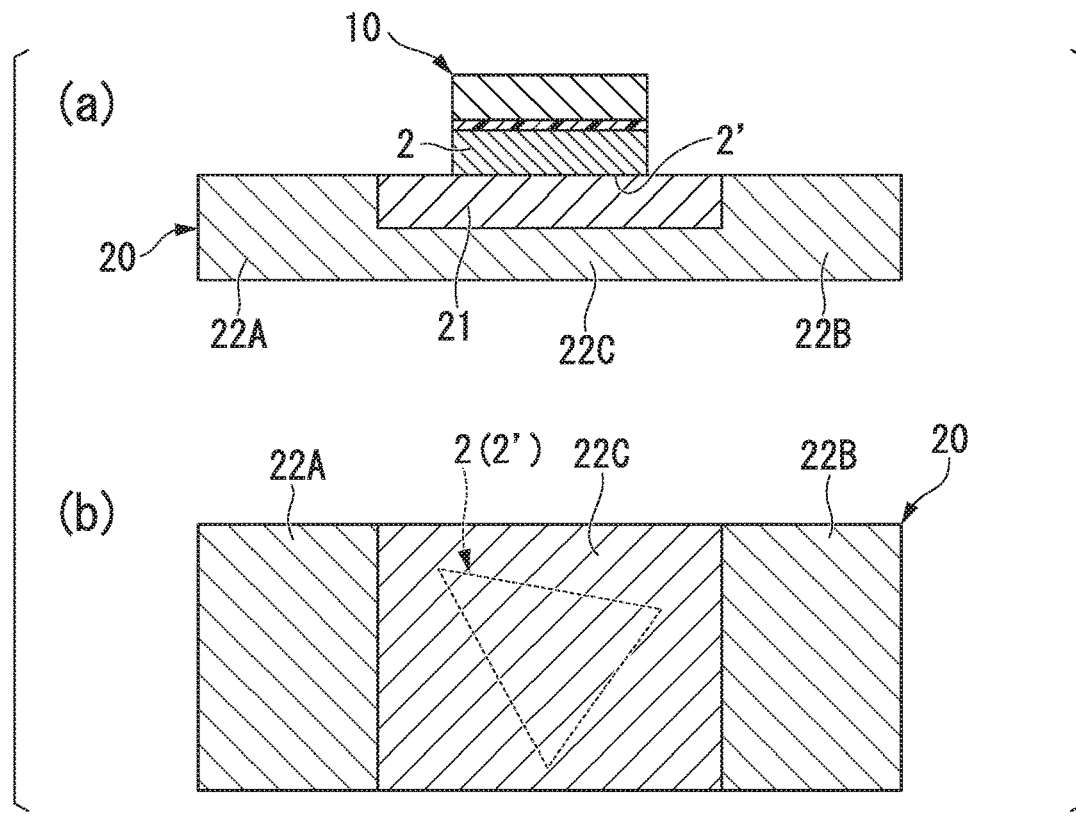
FIG. 12 is a schematic diagram showing another example of the spin-orbit torque wiring, where FIG. 12($a$) is a sectional view and FIG. 12($b$) is a plan view.

The spin-orbit torque wiring 20 shown in FIG. 12 overlaps such that the spin current generating part 21 includes the bonding portion 2' to the second ferromagnetic metal layer 2 in a plan view of the magnetoresistance effect element 20 when seen in the stacking direction. In the thickness direction of the spin-orbit torque wiring 20 in the part overlapping the magnetoresistance effect element 20, the spin current generating part 21 and the low-resistance part 22C are sequentially stacked from the second ferromagnetic metal layer 2 side. The part in which the spin current generating part 21 and the low-resistance part 22C are stacked is interposed between the low-resistance parts 22A and 22B in the direction in which a current flows. As a modified example of the spin-orbit torque wiring shown in FIG. 12, the spin current generating part may overlap the portion bonded to the second ferromagnetic metal layer in a plan view of the magnetoresistance effect element when seen in the stacking direction. The modified example has the same configuration as the spin-orbit torque wiring shown in FIG. 12 except this difference.

Figure 13:
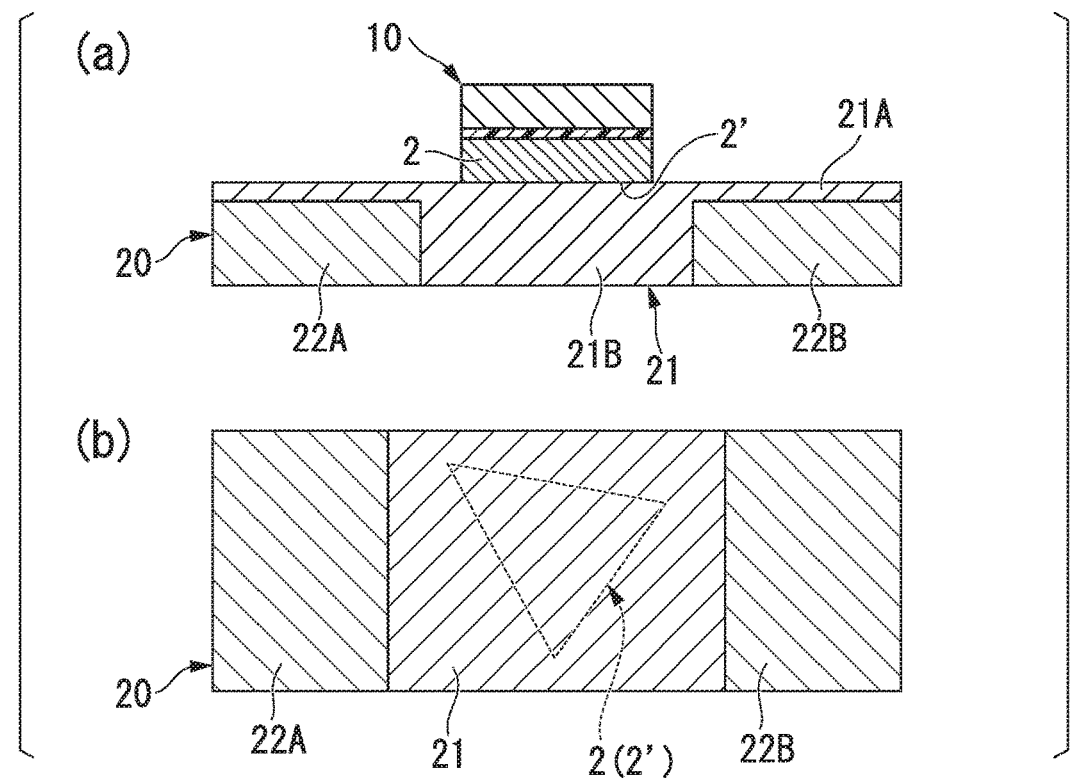
FIG. 13 is a schematic diagram showing another example of the spin-orbit torque wiring, where FIG. 13($a$) is a sectional view and FIG. 13($b$) is a plan view.

The spin-orbit torque wiring 20 shown in FIG. 13 overlaps such that the spin current generating part 21 includes the bonding portion 2' to the second ferromagnetic metal layer 2 in a plan view of the magnetoresistance effect element 20 when seen in the stacking direction. The part other than the overlapping part has a structure in which the low-resistance parts 22A and 22B and a protruding part 21A of the spin current generating part 21 are stacked. That is, the spin current generating part 21 extends to one surface side of the spin-orbit torque wiring 20.

In the configuration shown in FIG. 13, since the area in which the spin current generating part 21 and the low-resistance part 22 are in contact with each other is large, an adhesiveness between a nonmagnetic metal with a large atomic number constituting the spin current generating part 21 and a metal constituting the low-resistance part 22 is high.

Figure 14:
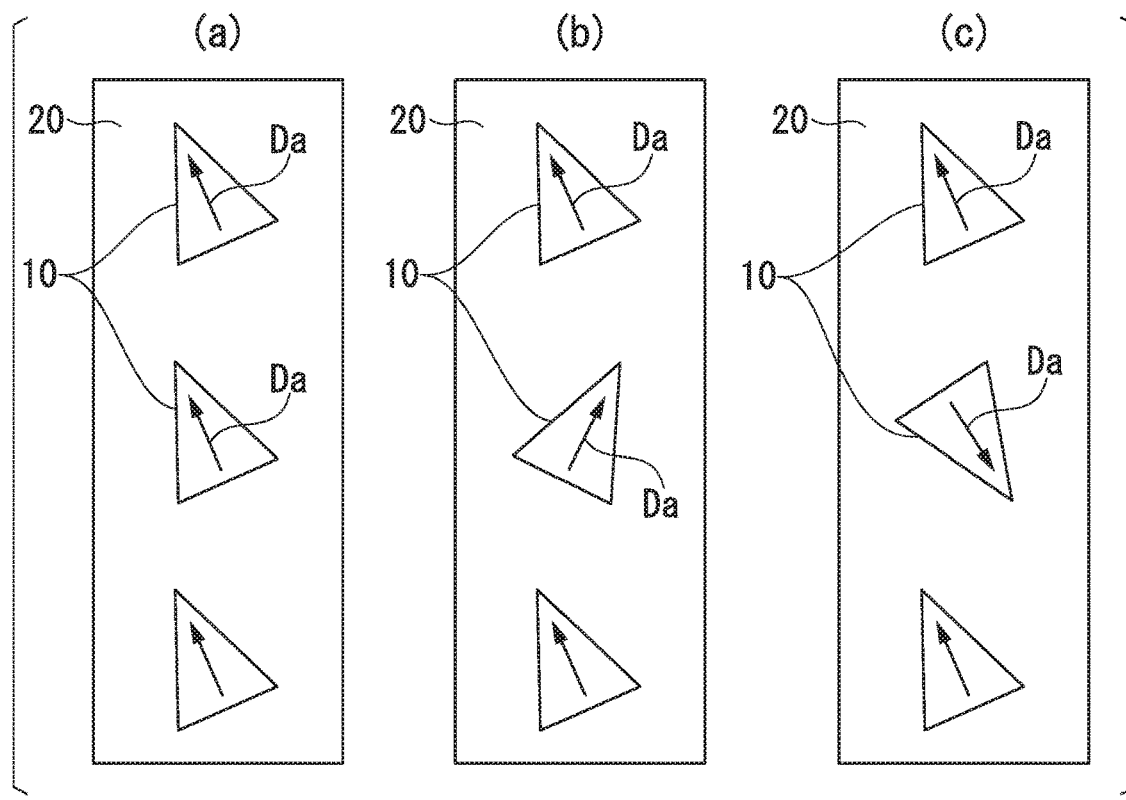
FIG. 14 is a plan view of a spin-current magnetization rotational element in which a plurality of magnetoresistance effect elements are formed for a single spin-orbit torque wiring.

A plurality of magnetoresistance effect elements 10 may be provided for a single spin-orbit torque wiring 20. FIG. 14 is a schematic diagram showing an example in which a plurality of magnetoresistance effect elements 10 are provided for a single spin-orbit torque wiring. The major axis direction Da of each magnetoresistance effect element 10 in FIG. 14 is an easy magnetization direction. A plurality of magnetoresistance effect elements 10 are arranged in a first direction in which the spin-orbit torque wiring 20 extends.

The easy magnetization axis directions of the magnetoresistance effect elements 10 may be equal to or different from each other. FIG. 14(*a*) shows an example in which the easy magnetization axes of the magnetoresistance effect elements 10 are the same. FIG. 14(*b*) shows an example in which the easy magnetization axes of the neighboring magnetoresistance effect elements 10 are parallel to the spin-orbit torque wiring 20 and are line-symmetric with respect to a line segment passing through the center in the width direction of the spin-orbit torque wiring 20. FIG. 14(*c*) shows an example in which the easy magnetization directions of the neighboring magnetoresistance effect elements 10 are opposite to each other.

When the easy magnetization axes are equal to each other as shown in FIG. 14(*a*), it is possible to easily manufacture the spin-current magnetization rotational element 100. On the other hand, when the easy magnetization directions of the neighboring magnetoresistance effect elements 10 are symmetric as shown in FIGS. 14(*b*) and 14(*c*), magnetization stability of the spin-current magnetization rotational element 100 as a whole is enhanced. This is because the magnetic fields generated from the magnetoresistance effect elements 10 cancel each other.

Examples in which the magnetoresistance effect element 10 is formed have been described hitherto. However, the magnetoresistance effect element 10 does not have to be formed. As described above, magnetization reversal due to an SOT is generated by an interaction between spins injected from the spin-orbit torque wiring 20 and magnetization of the second ferromagnetic metal layer 2 which is magnetization-reversible. That is, the spin-current magnetization rotational element 100 may include the second ferromagnetic metal layer 2 and the spin-orbit torque wiring 20. This spin-current magnetization rotational element can be used for an element using a magnetic Kerr effect or the like.

(Element Assembly)

Figure 15:
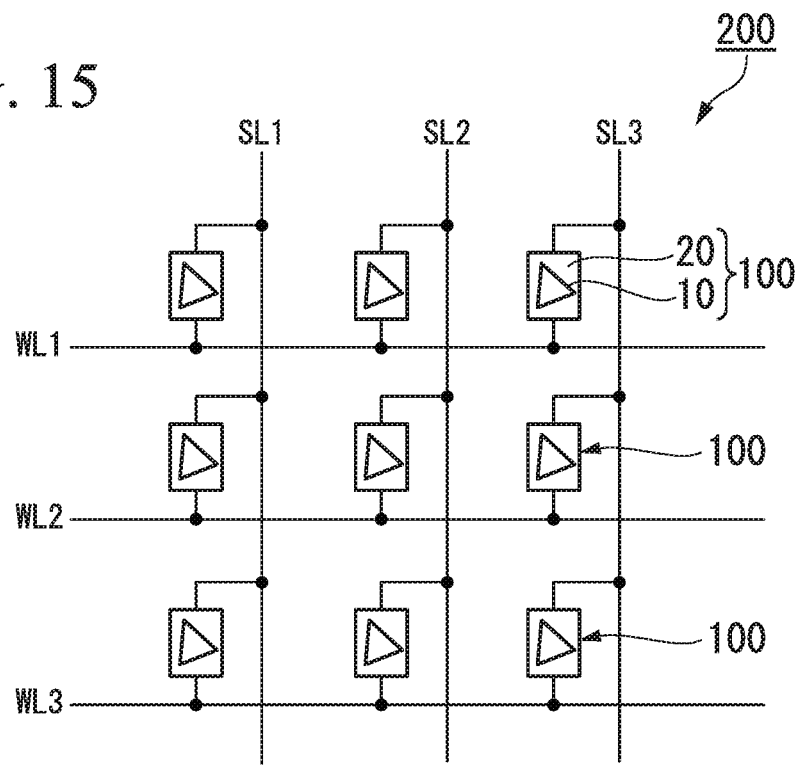
FIG. 15 is a diagram schematically showing an element assembly including a plurality of spin-current magnetization rotational elements.

FIG. 15 is a diagram schematically showing an element assembly 200 including a plurality of spin-current magnetization rotational elements 100. The element assembly 200 shown in FIG. 15 has an arrangement in which the spin-current magnetization rotational elements 100 are arranged in a matrix shape of 3×3. FIG. 15 shows an example of the element assembly 200, and the number of spin-current magnetization rotational elements 100 and the arrangement thereof are arbitrary.

Each spin-current magnetization rotational element 100 is connected to one of word lines WL1 to WL3 and one of source lines SL1 to SL3. By selecting the word lines WL1 to WL3 and the source lines SL1 to SL3 to which a current is applied, it is possible to allow a current to flow into the spin-orbit torque wiring 20 of an arbitrary spin-current magnetization rotational element 100.

When a current flows in the spin-orbit torque wiring 20, magnetization of the free layer of the magnetoresistance effect element 10 is reversed due to the SOT effect. In this way, it is possible to write data to an arbitrary element among a plurality of spin-current magnetization rotational elements 100.

In the element assembly 200, the ferromagnetic metal layers in the plurality of spin-current magnetization rotational elements 100 may have shape anisotropy in the same direction. When the ferromagnetic metal layers have shape anisotropy in the same direction, it means that the ferromagnetic metal layers have demagnetization anisotropy in the same direction. Accordingly, parts with a small restoring force applied to magnetization are oriented in the same direction.

When the spin-current magnetization rotational elements 100 constituting the element assembly 200 have the same configuration, the shapes of the word lines WL1 to WL3 and the source lines SL1 to SL3 connected to the elements can be formed in the same shape. That is, it is possible to avoid complication of a wiring configuration of the element assembly 200 and to enhance a degree of integration of the element assembly 200.

Figure 16:
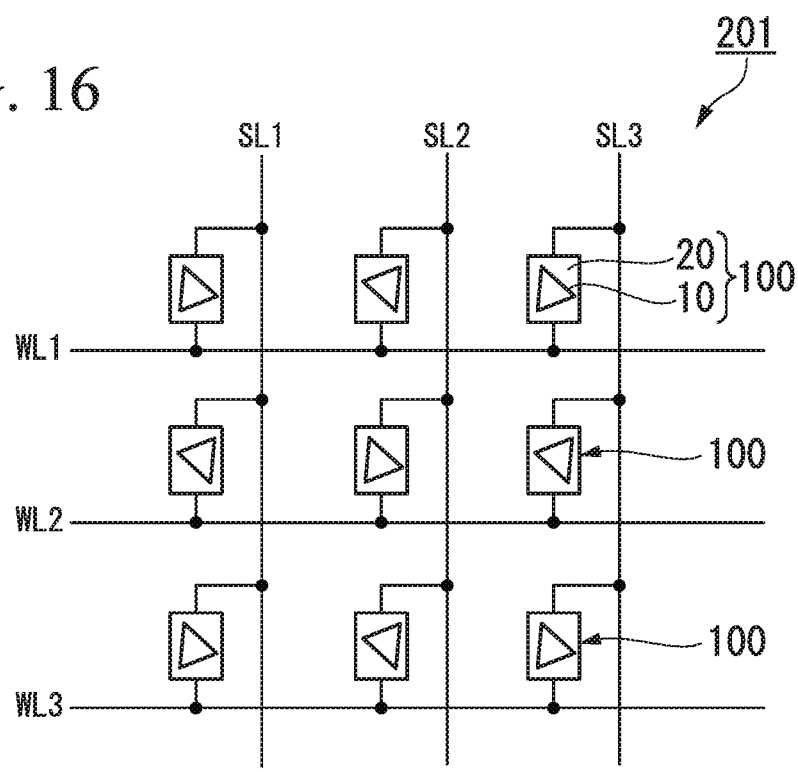
FIG. 16 is a diagram schematically showing an element assembly including a plurality of spin-current magnetization rotational elements.

On the other hand, as in an element assembly 201 shown in FIG. 16, the easy magnetization rotational directions of the neighboring magnetoresistance effect elements 10 (ferromagnetic metal layers) may be opposite to each other. When the neighboring easy magnetization axes have symmetry, it is possible to enhance magnetization stability of the element assembly 201 as a whole. This is because the magnetic fields generated from the magnetoresistance effect elements 10 cancel each other.

Figure 17:
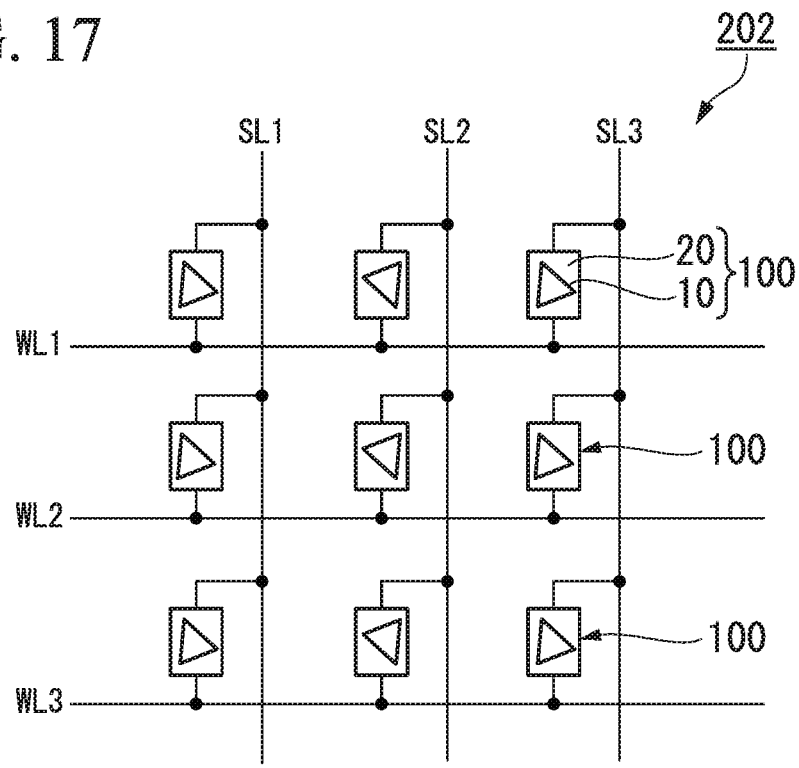
FIG. 17 is a diagram schematically showing an element assembly including a plurality of spin-current magnetization rotational elements.

The invention is not limited thereto, and the easy magnetization rotational directions of the magnetoresistance effect elements 10 (the ferromagnetic metal layers) may be changed for every spin-current magnetization rotational elements connected to the same source line SL1 to SL3 or the same word line WL1 to WL3. For example, FIG. 17 is a schematic diagram of an element assembly in which the same source line has the same easy magnetization axis.

REFERENCE SIGNS LIST 1, 11 First ferromagnetic metal layer
2, 12 Second ferromagnetic metal layer
3, 13 Nonmagnetic layer
10, 15, 16, 17, 18, 19A, 19B Magnetoresistance effect element
20 Spin-orbit torque wiring
100, 101, 102, 103, 104, 105 Spin-current magnetization rotational element
200, 201, 202 Element assembly
S1 First spin
S2 Second spin
I Current
Js Net spin current
M2, M12 Magnetization
Ra First rotation direction
Rb Second rotation direction
Da Major axis direction
Db Minor axis direction
M Midpoint
Y1 First point
Y2 Second point
A1 First area
A2 Second area
L Line segment
t Apex
PM Photo mask WL1 to WL3 Word line
SL1 to SL3 Source line

What is claimed is:

1. A spin-current magnetization rotational element, comprising:
a ferromagnetic layer configured for a magnetization direction to be changed; and
a spin-orbit torque wiring that extends in a first direction intersecting a stacking direction of the ferromagnetic layer and is bonded to the ferromagnetic layer, wherein
the ferromagnetic layer has unequal areas on opposed sides of a first line segment which passes midway between two points of the ferromagnetic layer that are separated most in a second direction perpendicular to the first direction, the first line segment is parallel to the first direction,
the ferromagnetic layer has unequal areas on opposed sides of a second line segment which passes midway between two points of the ferromagnetic layer that are separated most in the first direction, the second line segment is parallel to the second direction, and
the unequal areas on the opposed sides of the first line segment and the unequal areas on the opposed sides of the second line segment are in a plan view seen from the stacking direction.

2. The spin-current magnetization rotational element according to claim 1,
wherein a shape of the ferromagnetic layer in the plan view seen from the stacking direction is a polygon having 2n+1 (where n is a natural number) apexes.

3. The spin-current magnetization rotational element according to claim 2,
wherein all direction vectors from the center of gravity of the polygon to the apexes are different from a direction of a current flowing in the spin-orbit torque wiring.

4. The spin-current magnetization rotational element according to claim 3,
wherein the apexes of the polygon are curved.

5. The spin-current magnetization rotational element according to claim 3,
wherein a magnetization of the ferromagnetic layer is oriented in the stacking direction.

6. The spin-current magnetization rotational element according to claim 3,
wherein a nonmagnetic layer and a fixed layer in which a magnetization direction is fixed are additionally provided on a surface of the ferromagnetic layer opposite to the spin-orbit torque wiring.

7. The spin-current magnetization rotational element according to claim 2, wherein the apexes of the polygon are curved.

8. The spin-current magnetization rotational element according to claim 7, wherein a magnetization of the ferromagnetic layer is oriented in the stacking direction.

9. The spin-current magnetization rotational element according to claim 2,
wherein a magnetization of the ferromagnetic layer is oriented in the stacking direction.

10. The spin-current magnetization rotational element according to claim 2,
wherein a nonmagnetic layer and a fixed layer in which a magnetization direction is fixed are additionally provided on a surface of the ferromagnetic layer opposite to the spin-orbit torque wiring.

11. The spin-current magnetization rotational element according to claim 1,
wherein a magnetization of the ferromagnetic layer is oriented in the stacking direction.

12. The spin-current magnetization rotational element according to claim 1,
wherein a nonmagnetic layer and a fixed layer in which a magnetization direction is fixed are additionally provided on a surface of the ferromagnetic layer opposite to the spin-orbit torque wiring.

13. The spin-current magnetization rotational element according to claim 1, wherein
a plurality of ferromagnetic metal layers are arranged in the first direction in which the spin-orbit torque wiring extends,
each of the plurality of the ferromagnetic metal layers has a shape anisotropy in the plan view seen from the stacking direction and has a demagnetizing field distribution caused by the shape anisotropy,
easy magnetization rotational directions of each neighboring ferromagnetic metal layers in the plurality of ferromagnetic metal layers are opposite to each other,
the demagnetizing field distribution generates each of the easy magnetization rotational directions in which magnetizations of each of the plurality of the ferromagnetic metal layers are most easily reversed, and
each of the easy magnetization rotational directions intersects the first direction in the plan view seen from the stacking direction.

14. An element assembly, comprising:
a plurality of spin-current magnetization rotational elements, each of the plurality of spin-current magnetization rotational elements comprising:
a ferromagnetic layer configured for a magnetization direction to be changed; and
a spin-orbit torque wiring that extends in a first direction intersecting a stacking direction of the ferromagnetic layer and is bonded to the ferromagnetic layer, wherein
the ferromagnetic layer has unequal areas on opposed sides of a first line segment which passes midway between two points of the ferromagnetic layer that are separated most in a second direction perpendicular to the first direction, the first line segment is parallel to the first direction,
the ferromagnetic layer has unequal areas on opposed sides of a second line segment which passes midway between two points of the ferromagnetic layer that are separated most in the first direction, the second line segment is parallel to the second direction, and
the unequal areas on the opposed sides of the first line segment and the unequal areas on the opposed sides of the second line segment are in a plan view seen from the stacking direction.

15. The element assembly according to claim 14, wherein the ferromagnetic metal layer of each of the plurality of spin-current magnetization rotational elements has a shape anisotropy in the same direction.

16. The element assembly according to claim 14, wherein the ferromagnetic metal layer of each of the plurality of spin-current magnetization rotational elements has a shape anisotropy in the plan view seen from the stacking direction and has a demagnetizing field distribution caused by the shape anisotropy,
the demagnetizing field distribution generates an easy magnetization rotational direction in which magnetizations of the ferromagnetic metal layer of each of the plurality of spin-current magnetization rotational elements are most easily reversed, the easy magnetization rotational direction intersects the first direction in the plan view seen from the stacking direction, and the easy magnetization rotational directions of each neighboring ferromagnetic metal layers in the plurality of spin-current magnetization rotational elements are opposite to each other.

17. A spin-current magnetization rotational element, comprising:

a ferromagnetic layer configured for a magnetization direction to be changed; and a spin-orbit torque wiring that extends in a first direction intersecting a stacking direction of the ferromagnetic layer and is bonded to the ferromagnetic layer, wherein when the ferromagnetic layer is divided into two areas by a first line segment which passes through a midpoint between two points separated most in a second direction perpendicular to the first direction and which is parallel to the first direction, and the two areas are different from each other in a plan view seen from the stacking direction, and when the ferromagnetic layer is divided into two other areas by a second line segment which passes through a midpoint between two points separated most in the first direction and which is parallel to the second direction, and the two other areas are different from each other in the plan view seen from the stacking direction.

* * * * *